(12) United States Patent
Toda

(10) Patent No.: US 11,056,844 B2
(45) Date of Patent: Jul. 6, 2021

(54) CONNECTOR, DEVICE PROVIDED WITH THE SAME AND METHOD OF MANUFACTURING THE SAME

(71) Applicant: JAPAN AVIATION ELECTRONICS INDUSTRY, LIMITED, Tokyo (JP)

(72) Inventor: Kentaro Toda, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 111 days.

(21) Appl. No.: 16/532,518

(22) Filed: Aug. 6, 2019

(65) Prior Publication Data
US 2020/0099175 A1    Mar. 26, 2020

(30) Foreign Application Priority Data

Sep. 21, 2018 (JP) .............................. JP2018-177750

(51) Int. Cl.
H01R 12/00 (2006.01)
H01R 13/66 (2006.01)
(Continued)

(52) U.S. Cl.
CPC ......... *H01R 13/6658* (2013.01); *H01R 12/52* (2013.01); *H01R 12/7005* (2013.01);
(Continued)

(58) Field of Classification Search
CPC .. H01R 12/52; H01R 12/7005; H01R 12/721; H01R 12/722; H01R 13/6658;
(Continued)

(56) References Cited

U.S. PATENT DOCUMENTS 6,479,765 B2    11/2002    Ramey et al.
8,282,424 B2    10/2012    Weinmann et al.
(Continued)

FOREIGN PATENT DOCUMENTS

CN    201213178 Y    3/2009
CN    102349201 A    2/2012
(Continued)

OTHER PUBLICATIONS

Taiwanese Office Action (and English language translation thereof) dated Aug. 13, 2020 issued in counterpart Taiwanese Application No. 108128003.
(Continued)

*Primary Examiner* — Khiem M Nguyen
(74) *Attorney, Agent, or Firm* — Holtz, Holtz & Volek PC

(57) ABSTRACT

A connector has a main portion formed as a part of a multilayer wiring board and having a tongue shape. The multilayer wiring board is provided with a surface conductive layer and an inner conductive layer. The inner conductive layer is located apart from and inward of the surface conductive layer in an up-down direction. The main portion is provided with a grounding plate formed in the surface conductive layer and a plurality of contacts formed in the inner conductive layer. Each of the contacts is, at least in part, exposed and contactable in the up-down direction. Since the grounding plate and the contacts are formed in the conductive layers of the multilayer wiring board, the connector can possess desired electric characteristics in high accuracy.

11 Claims, 22 Drawing Sheets

(51) Int. Cl.
*H01R 12/72* (2011.01)
*H01R 12/52* (2011.01)
*H01R 12/70* (2011.01)
*H05K 1/02* (2006.01)
*H05K 1/11* (2006.01)
*H01R 24/62* (2011.01)

(52) U.S. Cl.
CPC ......... *H01R 12/721* (2013.01); *H01R 12/722* (2013.01); *H01R 24/62* (2013.01); *H05K 1/0298* (2013.01); *H05K 1/111* (2013.01); *H05K 2201/0723* (2013.01)

(58) Field of Classification Search
CPC ...... H01R 24/62; H05K 1/111; H05K 1/0298; H05K 2201/0723
USPC .............................................. 439/55, 79, 578
See application file for complete search history.

(56) References Cited

U.S. PATENT DOCUMENTS

| | | |
|---|---|---|
| 9,345,128 B2 | 5/2016 | Regnier |
| 9,413,117 B2 | 8/2016 | Hsu |
| 9,462,676 B2 | 10/2016 | Regnier |
| 9,698,535 B2 | 7/2017 | Cornelius et al. |
| 9,985,388 B2 | 5/2018 | Cornelius et al. |
| 2015/0255905 A1 | 9/2015 | Little et al. |
| 2015/0311642 A1 | 10/2015 | Rost et al. |
| 2016/0233616 A1 | 8/2016 | Regnier |
| 2019/0348785 A1 | 11/2019 | Tsai |

FOREIGN PATENT DOCUMENTS

| | | |
|---|---|---|
| CN | 102687350 A | 9/2012 |
| CN | 204179284 U | 2/2015 |
| CN | 104505624 A | 4/2015 |
| CN | 204333366 U | 5/2015 |
| CN | 204577744 U | 8/2015 |
| CN | 105470698 A | 4/2016 |
| CN | 206148724 U | 5/2017 |
| CN | 206412559 U | 8/2017 |
| CN | 206789769 U | 12/2017 |
| JP | 3210167 U | 4/2017 |
| TW | M390562 U | 10/2010 |
| TW | 201820714 A | 6/2018 |
| WO | 0201928 A1 | 1/2002 |

OTHER PUBLICATIONS

Chinese Office Action (and English language translation thereof) dated Nov. 4, 2020 issued in Chinese Application No. 201910732950.6.

CONNECTOR, DEVICE PROVIDED WITH THE SAME AND METHOD OF MANUFACTURING THE SAME

CROSS REFERENCE TO RELATED APPLICATIONS

This application is based on and claims priority under 35 U.S.C. § 119 to Japanese Patent Application No. JP2018-177750 filed Sep. 21, 2018, the contents of which are incorporated herein in their entireties by reference.

BACKGROUND OF THE INVENTION

This invention relates to a connector, a device provided with the connector and a method of manufacturing the connector. In particular, the invention relates to a connector having a main portion formed as a part of a circuit board, a device provided with the connector and a method of manufacturing the connector.

Referring to FIG. 22, a receptacle (a connector) 90 described in U.S. Pat. No. 9,413,117 B2 (Patent Document 1) is provided with a printed circuit board 92, a grounding component 94 and a conductive shell 96. The printed circuit board 92 has a tongue-shaped portion 922 forming a connector main portion. On a surface of the printed circuit board 92, a rear pad 924 and a pair of side pads 926 are provided near the tongue-shaped portion 922. The grounding component 94 has a grounding contacts 942 and a grounding pad 944. The grounding component 94 is attached to a rear portion of the tongue-shaped portion 922 and electrically connected to the rear pad 924. The conductive shell 96 is combined with the grounding component 94 and connected to the printed circuit board 92. The grounding component 94 is electrically connected to the side pads 926.

The receptacle 90 is mateable with and removable from a plug (a mating connector, not shown). The plug is provided with a plurality of mating contacts (not shown) and a mating grounding member (not shown). When the receptacle 90 is mated with the plug, the grounding contacts 942 of the grounding component 94 are brought into contact with the mating contacts of the plug, respectively, which correspond the grounding contacts 942. At this time, the grounding pad 944 is brought into contact with the mating grounding member.

SUMMARY OF THE INVENTION

In the receptacle 90 of Patent Document 1, the grounding component 94 is distinct and separated from the printed circuit board 92. Because of this, a position of the grounding component 94 with respect to the printed circuit board 92 varies according to attaching accuracy thereof. This means that positions of the grounding contacts 942 and the grounding pad 944 with respect to the printed circuit board 92 vary according to attaching accuracy of the grounding component 94. The variation of the positions of the grounding contacts 942 and the grounding pad 944 varies electrical characteristics of the receptacle 90. Thus, the receptacle 90 of Patent Document 1 has a problem of variation of electrical characteristics thereof.

It is an object of the present invention to provide a connector having a structure capable of possessing desired electric characteristics with high accuracy.

It is another object of the present invention to provide a device provided with such a connector.

It is yet another object of the present invention to provide a method of manufacturing such a connector.

One aspect of the present invention provides a connector which has a main portion formed as a part of a multilayer wiring board and having a tongue shape. The multilayer wiring board comprises a surface conductive layer and an inner conductive layer. The inner conductive layer is located apart from and inward of the surface conductive layer in an up-down direction. The main portion comprises a grounding plate formed in the surface conductive layer and a plurality of contacts formed in the inner conductive layer. Each of the contacts is, at least in part, exposed and contactable in the up-down direction.

Another aspect of the present invention provides a device comprising the connector. The multilayer wiring board further comprises an additional surface conductive layer and an additional inner conductive layer. Positions of the additional surface conductive layer and the additional inner conductive layer and positions of the surface conductive layer and the inner conductive layer are symmetrical with respect to a plane in the up-down direction. The main portion comprises an additional grounding plate formed in the additional surface conductive layer and a plurality of additional contacts formed in the additional inner conductive layer. Each of the additional contacts is, at least in part, exposed and contactable in the up-down direction. The connector further comprises a guide member fixed to the multilayer wiring board. The guide member covers the main portion in directions perpendicular to a front-rear direction perpendicular to the up-down direction. The device comprises a main board portion formed of the multilayer wiring board and formed integrally with the main portion. The main board portion has a body portion and a positioning portion. Each of the main portion and the positioning portion protrudes forward from the body portion in the front-rear direction. The positioning portion is provided with conductive pads which are formed in the surface conductive layer and the additional surface conductive layer, respectively. The guide member is provided with a receiving portion which receives, at least in part, the positioning portion. In a state before the positioning portion is received by the receiving portion, the receiving portion is slightly smaller than the positioning portion in size in the up-down direction.

Yet another aspect of the present invention provides a method of manufacturing a connector. The connector has a main portion which is formed as a part of a multilayer wiring board and which has a tongue shape. The method comprises: preparing the multilayer wiring board; forming a grounding plate in a surface conductive layer of the multilayer wiring board in a predetermined section of the multilayer wiring board which is to be the main portion; and cutting, in the predetermined section, an insulation layer of the multilayer wiring board located forward of the grounding plate in a front-rear direction to expose an inner conductive layer of the multilayer wiring board in part. The inner conductive layer exposed forms contacts so that the main portion is formed.

According to the present invention, the connector has the main portion which is formed of the multilayer wiring board and has a tongue shape. The multilayer wiring board is provided with the surface conductive layer and the inner conductive layer. The main portion is provided with the grounding plate formed in the surface conductive layer and the plurality of the contacts formed in the inner conductive layer. Positioning accuracy of the grounding plate and the contacts depends on pattern forming accuracy of the multilayer wiring board. The pattern forming accuracy is significantly high in comparison with attaching accuracy for attaching a certain component to another component. Accordingly, one aspect of the present invention can provide a connector having a structure capable of possessing desired electric characteristics with high accuracy. Moreover, another aspect of the present invention can provide a device provided with a connector which has a structure capable of possessing desired electric characteristics with high accuracy. Furthermore, still another aspect of the present invention can provide a method of manufacturing a connector which has a structure capable of possessing desired electric characteristics with high accuracy.

An appreciation of the objectives of the present invention and a more complete understanding of its structure may be had by studying the following description of the preferred embodiment and by referring to the accompanying drawings.

Figure 1:
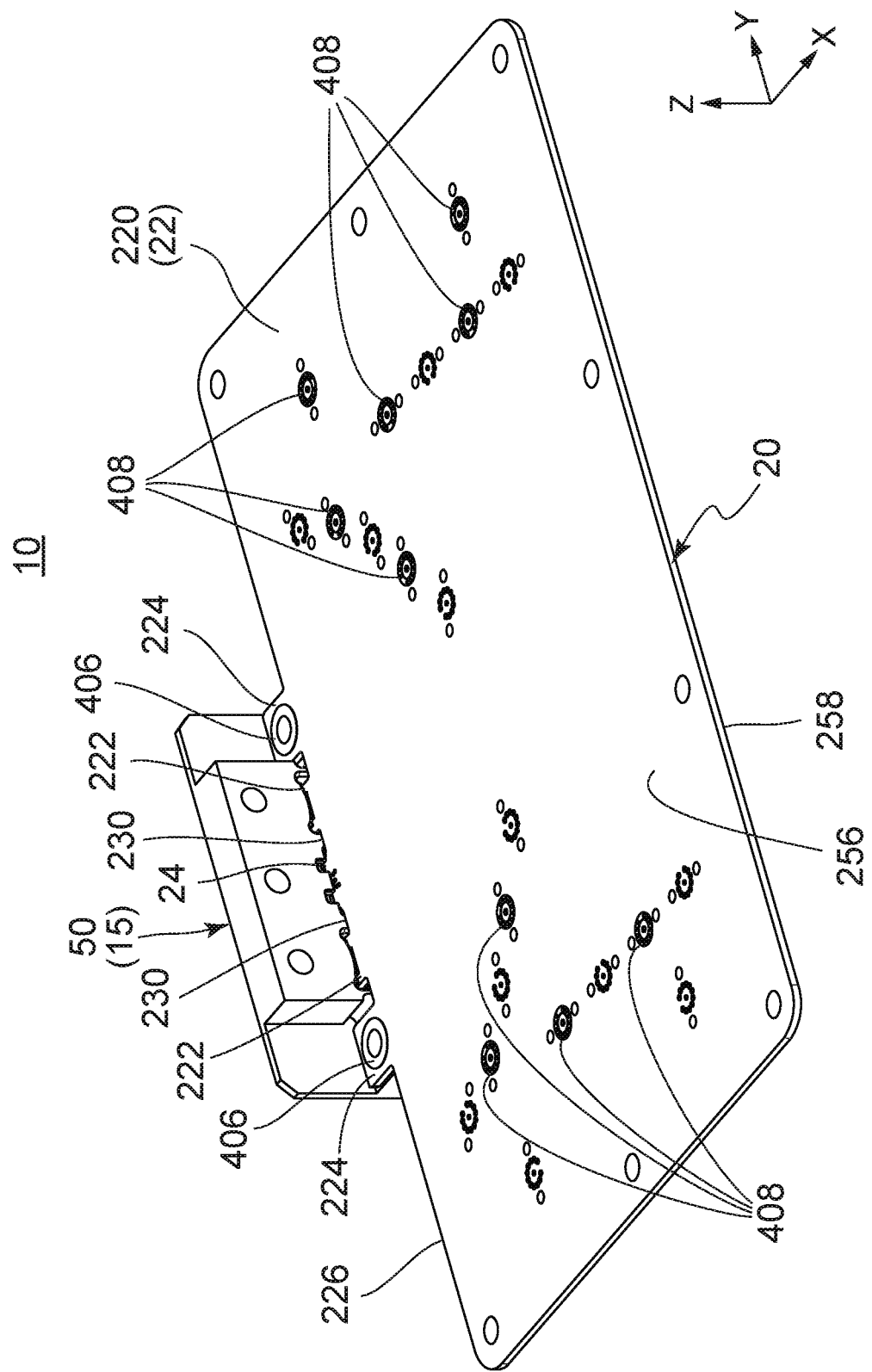
FIG. 1 is a rear, perspective view showing a device according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 2:
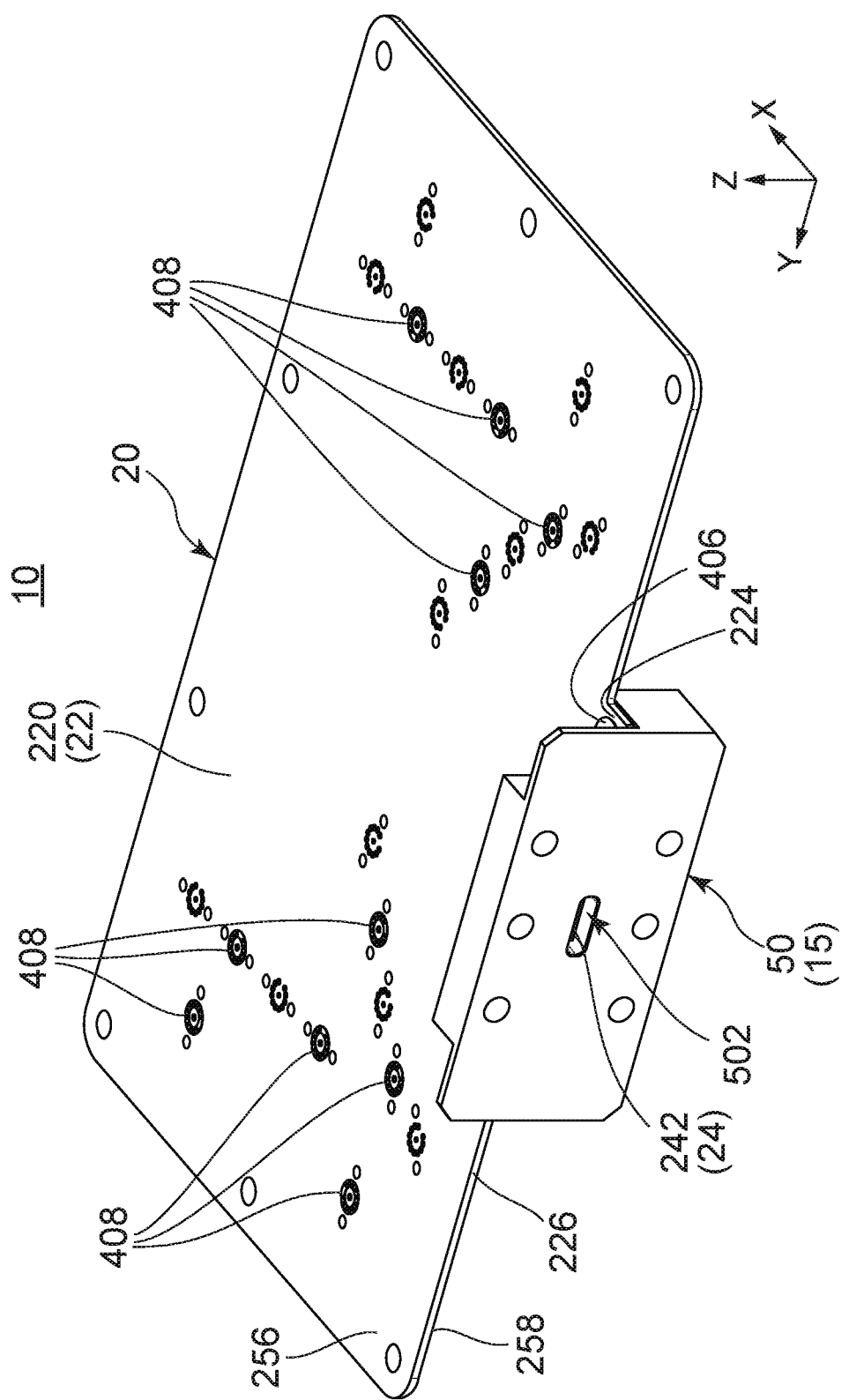
FIG. 2 is a front, perspective view showing the device of FIG. 1.
Figure 3:
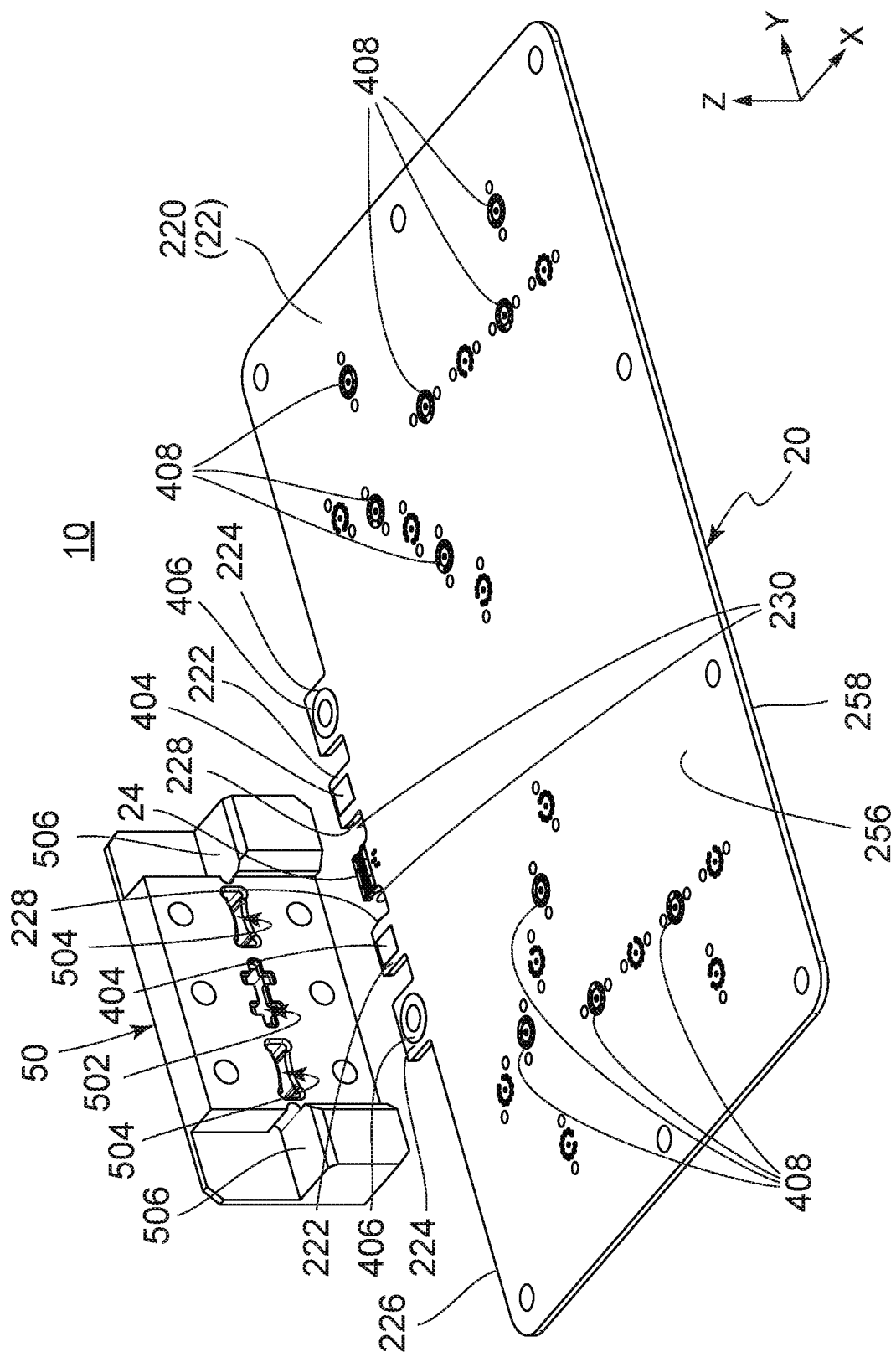
FIG. 3 is an exploded, rear, perspective view showing the device of FIG. 1.
Figure 4:
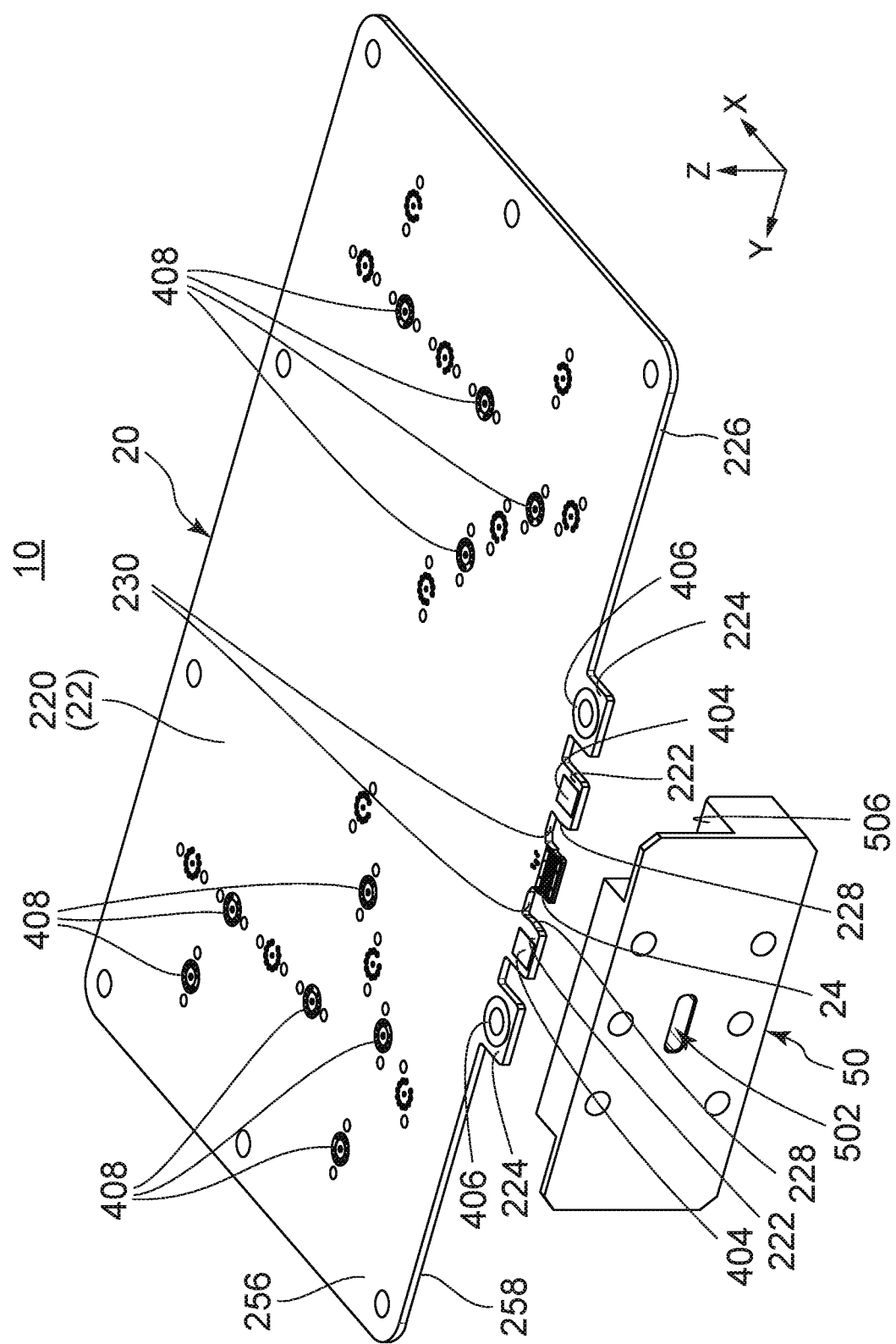
FIG. 4 is an exploded, front, perspective view showing the device of FIG. 2.

Referring to FIGS. 1 and 2, a device 10 according to an embodiment of the present invention is provided with a multilayer wiring board 20 and a guide member 50. As shown in FIGS. 3 and 4, the multilayer wiring board 20 is provided with a main board portion 22 and a connector main portion (a main portion) 24. In other words, the main board portion 22 and the connector main portion 24 are integrally formed of the multilayer wiring board 20. Thus, the device 10 is provided with the main board portion 22 formed as a part of the multilayer wiring board 20 and formed integrally with the connector main portion 24.

Figure 5:
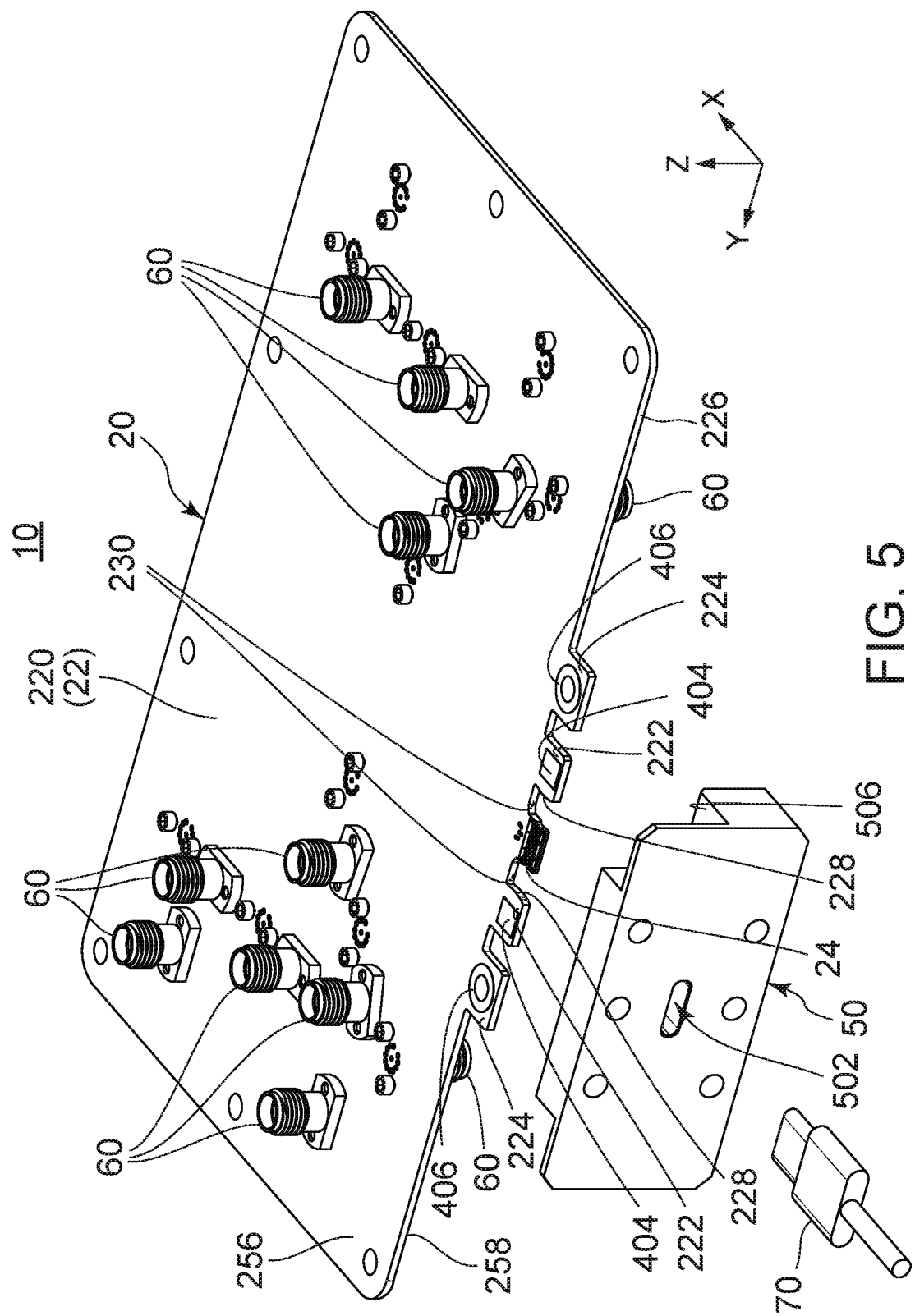
FIG. 5 is another exploded, front, perspective view showing the device of FIG. 4. On a multilayer wiring board of the device, connection terminals are mounted. A connector included in the device and a mating connector are not yet mated with each other.
Figure 6:
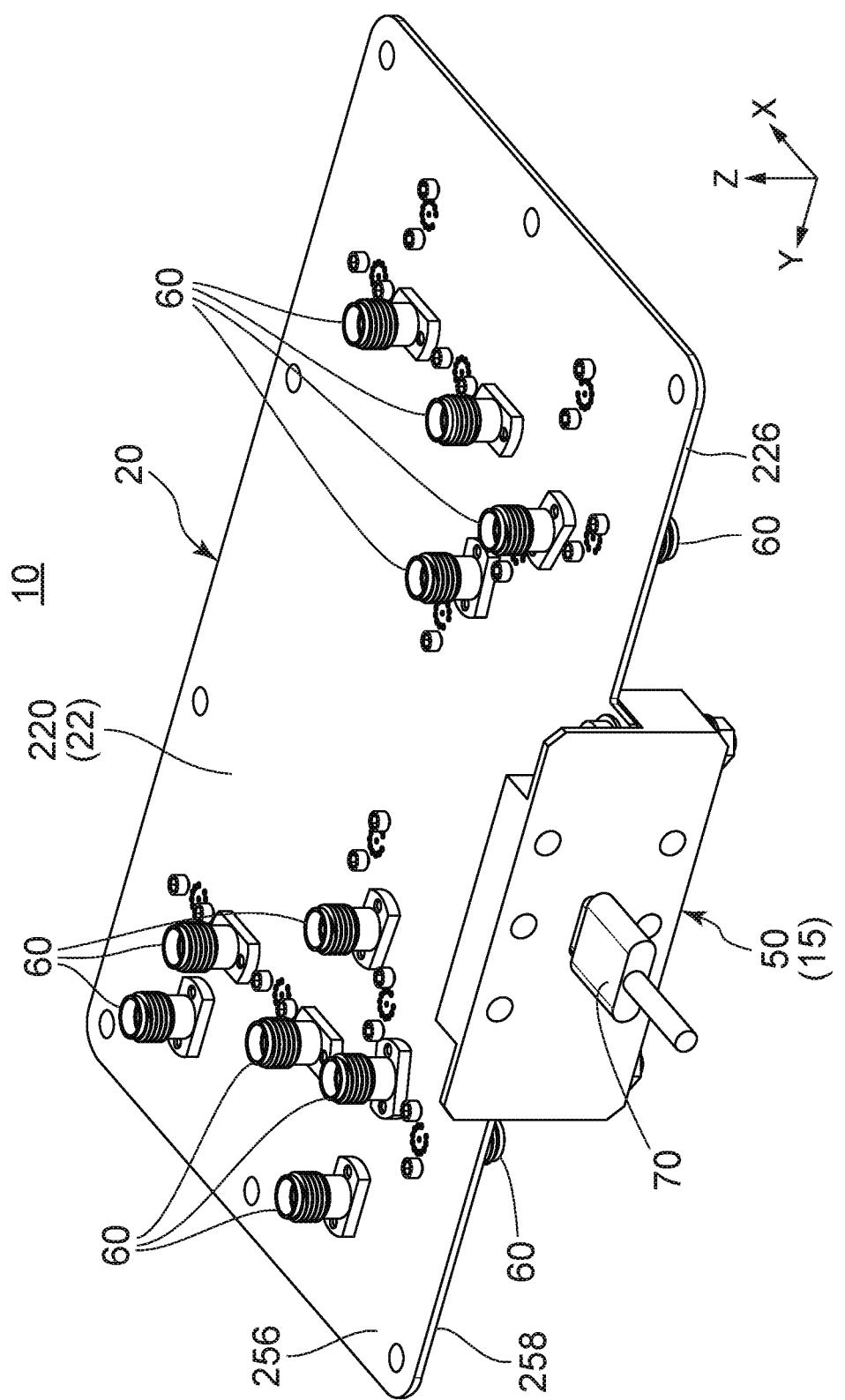
FIG. 6 is a front, perspective view showing the device of FIG. 5. A guide member of the device is fixed to the multilayer wiring board with bolts and nuts. The connector included in the device and the mating connector are mated with each other.

As understood from FIGS. 5 and 6, the guide member 50 is attached and fixed to the multilayer wiring board 20. However, the present invention is not limited thereto. Fixing of the guide member 50 may be changed so long as the guide member 50 meets a predetermined positional relation with respect to the connector main portion 24 to work as a so-called shell which surrounds the connector main portion 24. Accordingly, each of a shape, a fixing destination and a fixing method of the guide member 50 may be changed. Moreover, in the present embodiment, the guide member 50 together with the connector main portion 24 forms a connector 15, which is mateable with and removable from a mating connector 70. Thus, the device 10 is provide with the connector 15, and the connector 15 has the connector main portion 24 formed of the multilayer wiring board 20. In the present embodiment, the connector 15 is formed to conform to the standard of USB type-C. However, the present invention is not limited thereto. The present invention is applicable to any connector.

As shown in FIGS. 5 and 6, the device 10 is further provided with a plurality of connection terminals 60 mounted on each of an upper surface 256 and a lower surface 258 of the multilayer wiring board 20. The connector 15 is connected to the connection terminals 60 electrically. In the present embodiment, the connector main portion 24 is integrally formed with the main board portion 22. However, the present invention is not limited thereto. The connector main portion 24 may be formed of another multilayer wiring board different from the multilayer wiring board 20 forming the main board portion 22.

As shown in FIGS. 3 to 5, the main board portion 22 of the multilayer wiring board 20 has a body portion 220, a pair of positioning portions 222 and a pair of fixing portions 224. As understood from FIG. 7, the body portion 220 has a rounded rectangular shape when viewed along an up-down direction. In the present embodiment, the up-down direction is a Z-direction. A positive Z-direction is directed upward while a negative Z-direction is directed downward. The positioning portions 222 and the fixing portions 224 are provided on one side of the body portion 220. In detail, the positioning portions 222 and the fixing portions 224 protrude forward in a front-rear direction perpendicular to the up-down direction from a front edge 226 of the body portion 220. Each of the positioning portions 222 and the fixing portions 224 has an approximately rectangular shape when viewed along the up-down direction. In the present embodiment, the front-rear direction is an X-direction. A negative X-direction is directed forward while a positive X-direction is directed rearward.

Figure 7:
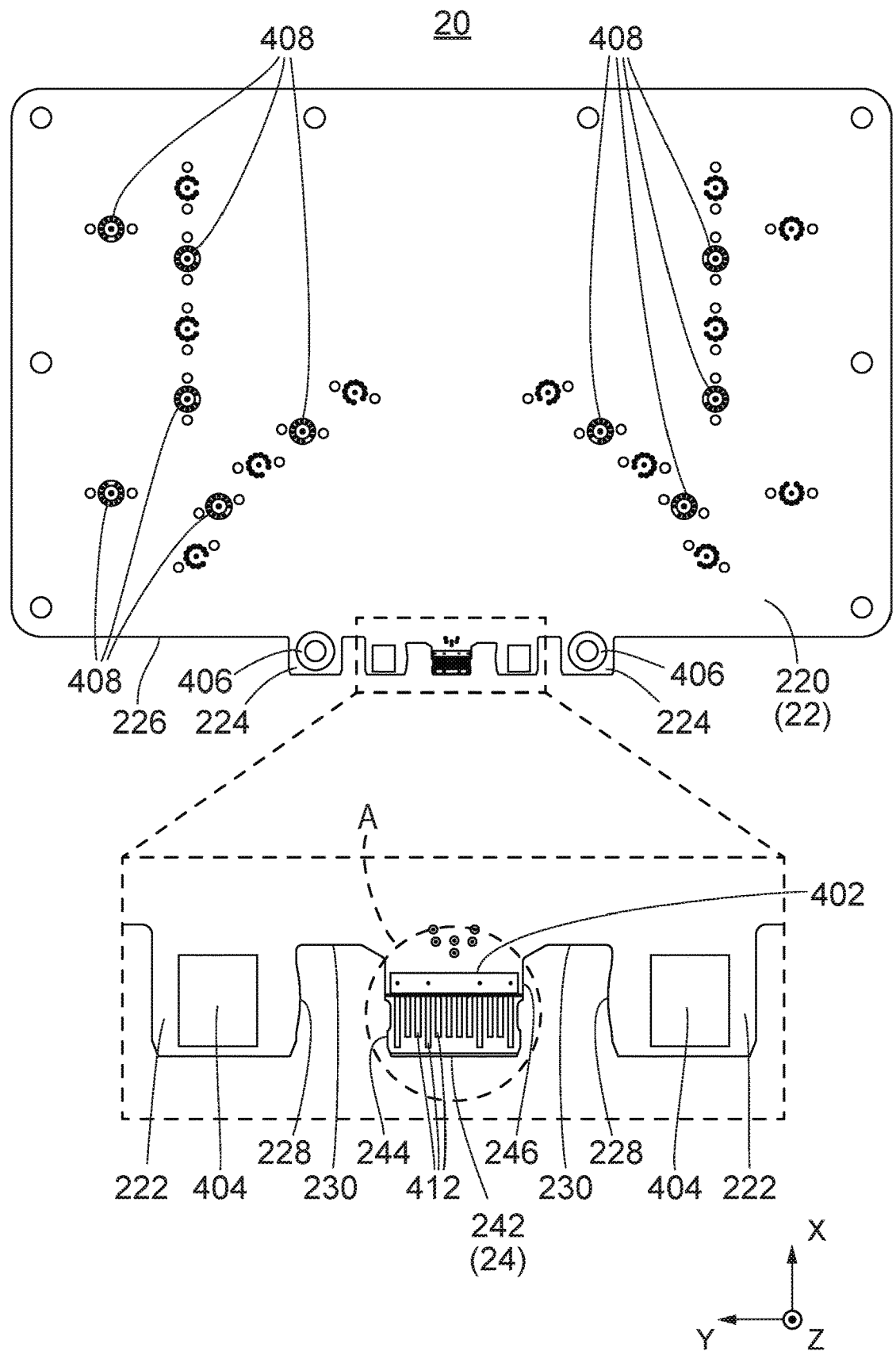
FIG. 7 is a plan view showing the multilayer wiring board included in the device of FIG. 4. A connector main portion, positioning portions and a vicinity of them are enlarged and drawn.

As shown in FIG. 7, the connector main portion 24 protrudes forward in the front-rear direction from the front edge 226 of the body portion 220. Furthermore, in the present embodiment, the connector main portion 24 is located in the middle of the body portion 220 in a lateral direction perpendicular to both of the up-down direction and the front-rear direction. The connector main portion 24 is located between the positioning portions 222 in the lateral direction. In other words, the positioning portions 222 are located outward of the connector main portion 24 in the lateral direction. The fixing portions 224 are located outward of the positioning portions 222 in the lateral direction. In other words, each of the positioning portions 222 is located between either one of the fixing portions 224 and the connector main portion 24 in the lateral direction. In the present embodiment, the lateral direction is a Y-direction.

Figure 8:
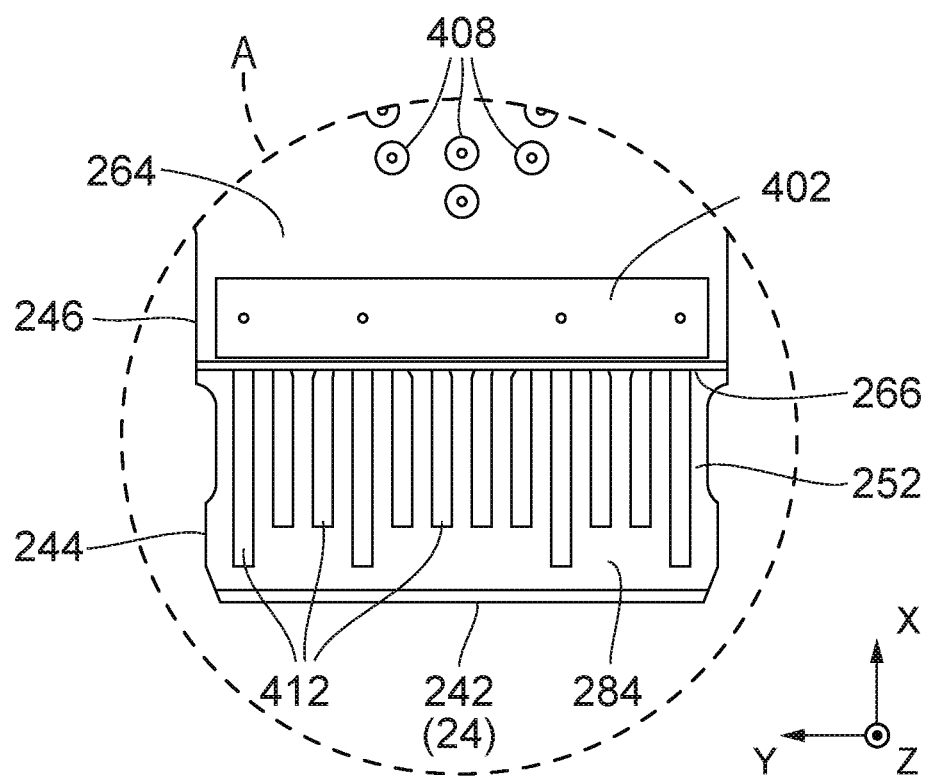
FIG. 8 is an enlarged view showing a region surrounded by a broken line A of FIG. 7.
Figure 9:
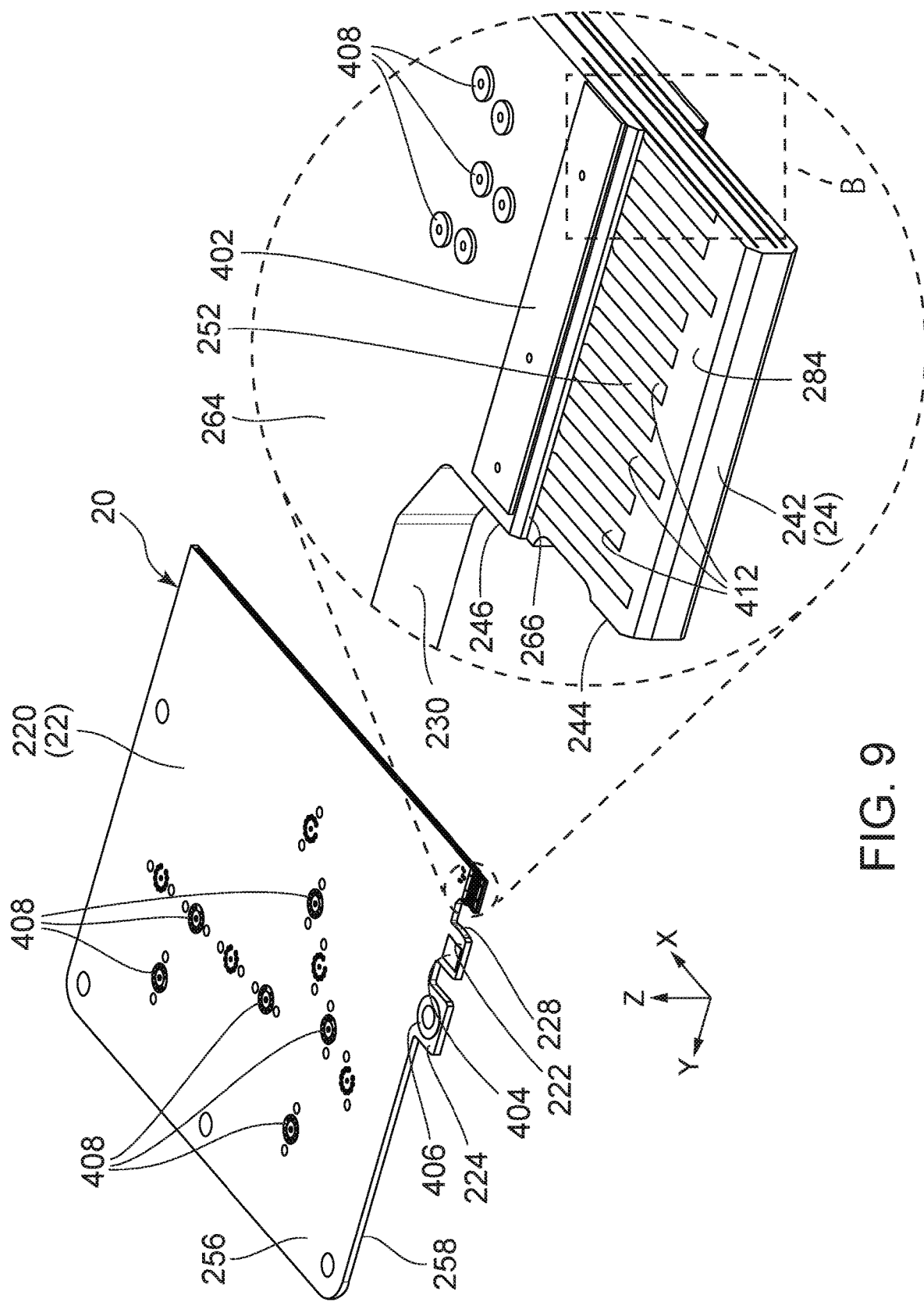
FIG. 9 is a front, perspective view showing a part obtained by cutting the multilayer wiring board included in the device of FIG. 4. The connector main portion and a vicinity thereof are enlarged and drawn.

As understood from FIGS. 7 to 9, the connector main portion 24 has a tongue shape. In other words, the connector 15 (see FIG. 2) is provided with the connector main portion 24 formed as a part of the multilayer wiring board 20 and having the tongue shape. In detail, in the lateral direction, a front portion 244 of the connector main portion 24 is smaller than a rear portion 246 of the connector main portion 24 in size. Moreover, in the up-down direction, the front portion 244 of the connector main portion 24 is smaller than the rear portion 246 of the connector main portion 24 in size. Furthermore, a front end portion 242 of the connector main portion 24 is tapered in each of the lateral direction and the up-down direction.

Figure 10:
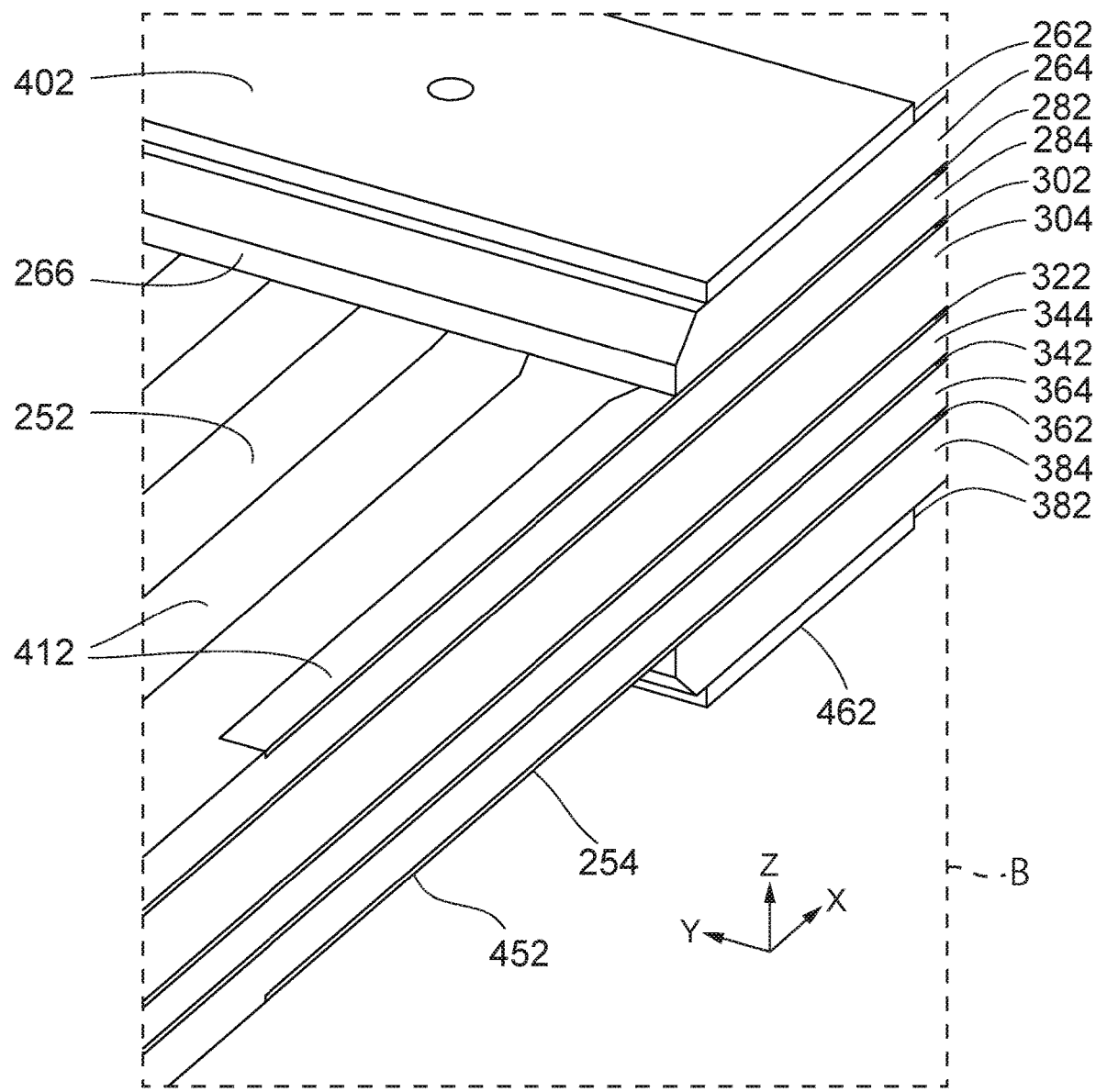
FIG. 10 is an enlarged view showing a region surrounded by a broken line B of FIG. 9.

As shown in FIG. 10, the multilayer wiring board 20 (see FIG. 9) is formed by conductive layers and insulation layers which are laminated alternatively. In detail, the multilayer wiring board 20 is provided with a first conductive layer (a surface conductive layer) 262, a first insulation layer 264, a second conductive layer (an inner conductive layer) 282, a second insulation layer 284, a third conductive layer 302, a third insulation layer 304, a fourth conductive layer 322, a fourth insulation layer 344, a fifth conductive layer 342, a fifth insulation layer 364, a sixth conductive layer (an additional inner conductive layer) 362, a sixth insulation layer 384 and a seventh conductive layer (an additional surface conductive layer) 382, which are positioned from top to bottom in this order. A method of manufacturing the multilayer wiring board 20 is not specially limited. For example, the multilayer wiring board 20 may be manufactured by laminating wiring substrates, each of which has an insulator layer and a conductive layer(s) formed on one side or both sides of the insulation layer. Moreover, the multilayer wiring board 20 may be manufactured by laminating insulation layers and conductive layers one by one. Furthermore, the method of laminating the wiring substrates and the method of laminating the insulation layers and the conductive layers one by one may be combined.

As understood from FIGS. 9 and 10, the multilayer wiring board 20 is provided with the surface conductive layer 262 and the inner conductive layer 282. The inner conductive layer 282 is located apart from and inward of the surface conductive layer 262 in the up-down direction. Moreover, the surface conductive layer 262 is formed on the first insulation layer 264. The first insulation layer 264 is located between the surface conductive layer 262 and the inner conductive layer 282 in the up-down direction. The multilayer wiring board 20 is further provided with the additional surface conductive layer 382 and the additional inner conductive layer 362. The additional inner conductive layer 362 is located apart from and inward of the additional surface conductive layer 382 in the up-down direction. Moreover, the additional surface conductive layer 382 is formed beneath the sixth insulation layer 384. The sixth insulation layer 384 is located between the additional surface conductive layer 382 and the additional inner conductive layer 362 in the up-down direction.

As understood from FIG. 10, each of the second to the sixth conductive layers 282, 302, 322, 342 and 362 is, at least in part, embedded in the insulation layer adjacent thereto. In addition, the insulation layers adjacent to each other are partly contiguous with each other in the up-down direction. For instance, in the present embodiment, the second conductive layer 282 is, at least in part, embedded in the second insulation layer 284. Moreover, the sixth conductive layer 362 is, at least in part, embedded in the fifth insulation layer 364. In the present embodiment, the second insulation layer 284 is contiguous partly with the first insulation layer 264 in the up-down direction. Moreover, in the present embodiment, the fifth insulation layer 364 is contiguous partly with the sixth insulation layer 384 in the up-down direction.

As shown in FIGS. 11 to 17, each of the first to the seventh conductive layers 262, 282, 302, 322, 342, 362 and 382 has at least one conductive pattern. The conductive pattern is made by way of printing wiring technique with high accuracy.

Figure 11:
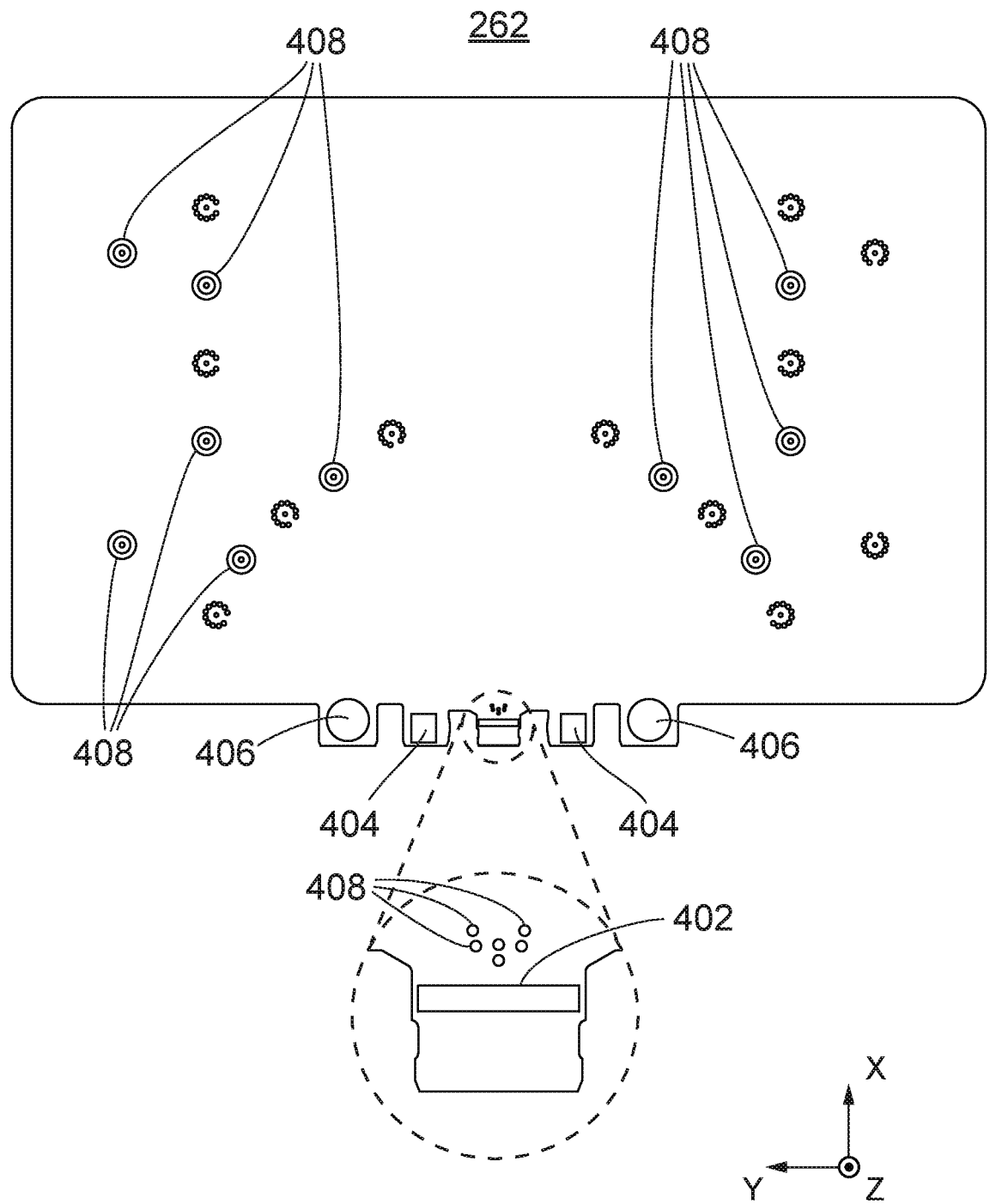
FIG. 11 is a plan view showing a first conductive layer included in the multilayer wiring board of FIG. 7. The first conductive layer is in a state before via holes and screw holes are formed. An outline of the multilayer wiring board is also drawn. A region corresponding to the connector main portion and a vicinity thereof are enlarged and drawn.

Referring to FIG. 11, the first conductive layer 262 is formed with a grounding plate 402 as one of the conductive patterns. The grounding plate 402 is formed to be included in the connector main portion 24 (see FIG. 7). Thus, the connector main portion 24 is provided with the grounding plate 402 formed in the first conductive layer (the surface conductive layer) 262. The grounding plate 402 has a rectangular shape long in the lateral direction when viewed along the up-down direction. The grounding plate 402 is surface symmetrical with respect to an imaginary plane which is perpendicular to the lateral direction and passes the middle of the grounding plate 402 in the lateral direction. The first conductive layer 262 is further formed with two pairs of conductive pads 404 and 406. The conductive pads 404 are formed to be included in the positioning portions 222 (see FIG. 7), respectively. In other words, the positioning portions 222 are provided with the conductive pads 404, respectively, which are formed in the first conductive layer 262. The conductive pads 406 are formed to be included in the fixing portions 224 (see FIG. 7), respectively. In other words, the fixing portions 224 are provided with the conductive pads 406, respectively, which are formed in the first conductive layer 262. In the present embodiment, each of the conductive pads 404 has a rectangular shape when viewed along the up-down direction, and each of the conductive pads 406 has a circular shape when viewed along the up-down direction. The first conductive layer 262 is further formed with a plurality of lands 408 corresponding to the connection terminals 60.

Figure 12:
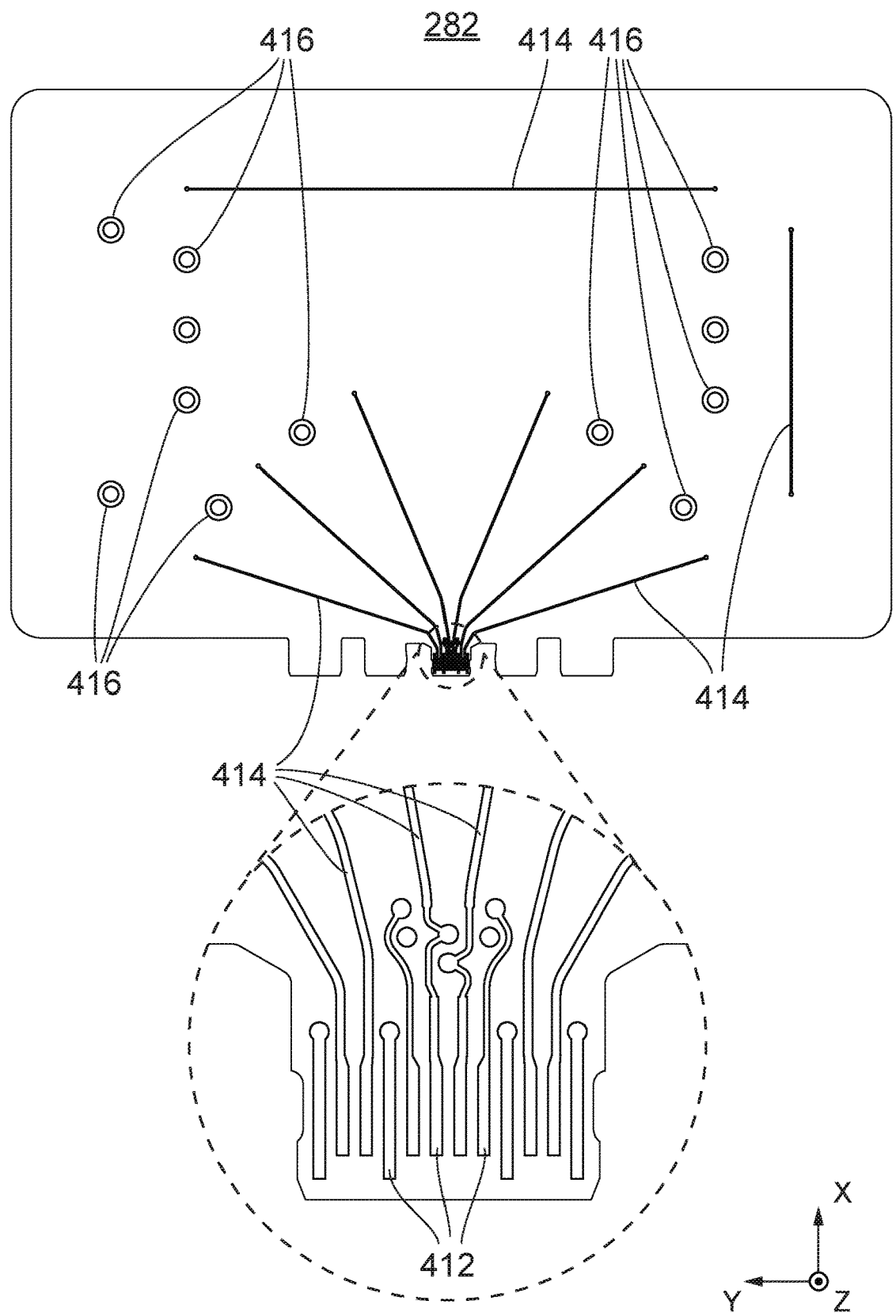
FIG. 12 is a plan view showing a second conductive layer included in the multilayer wiring board of FIG. 7. The second conductive layer is in a state before the via holes and the screw holes are formed. The outline of the multilayer wiring board is also drawn. The region corresponding to the connector main portion and the vicinity thereof are enlarged and drawn.

Referring to FIG. 12, the second conductive layer 282 is provided with a plurality of contacts 412 as some of the conductive patterns. The contacts 412 are formed to be included in the connector main portion 24 (see FIG. 7). Thus, the connector main portion 24 is provided with the contacts 412 formed in the second conductive layer (the inner conductive layer) 282. An arrangement of the contacts 412 is symmetrical with respect to an imaginary plane perpendicular to the lateral direction. In the present embodiment, each of the contacts 412 has a rectangular shape when viewed along the up-down direction. The second conductive layer 282 is further formed with a plurality of wirings 414. In the present embodiment, six of the wirings 414 are formed to be continuous with six of the contacts 412, respectively. The second conductive layer 282 is further formed with a plurality of lands 416 corresponding to the connection terminals 60.

Figure 13:
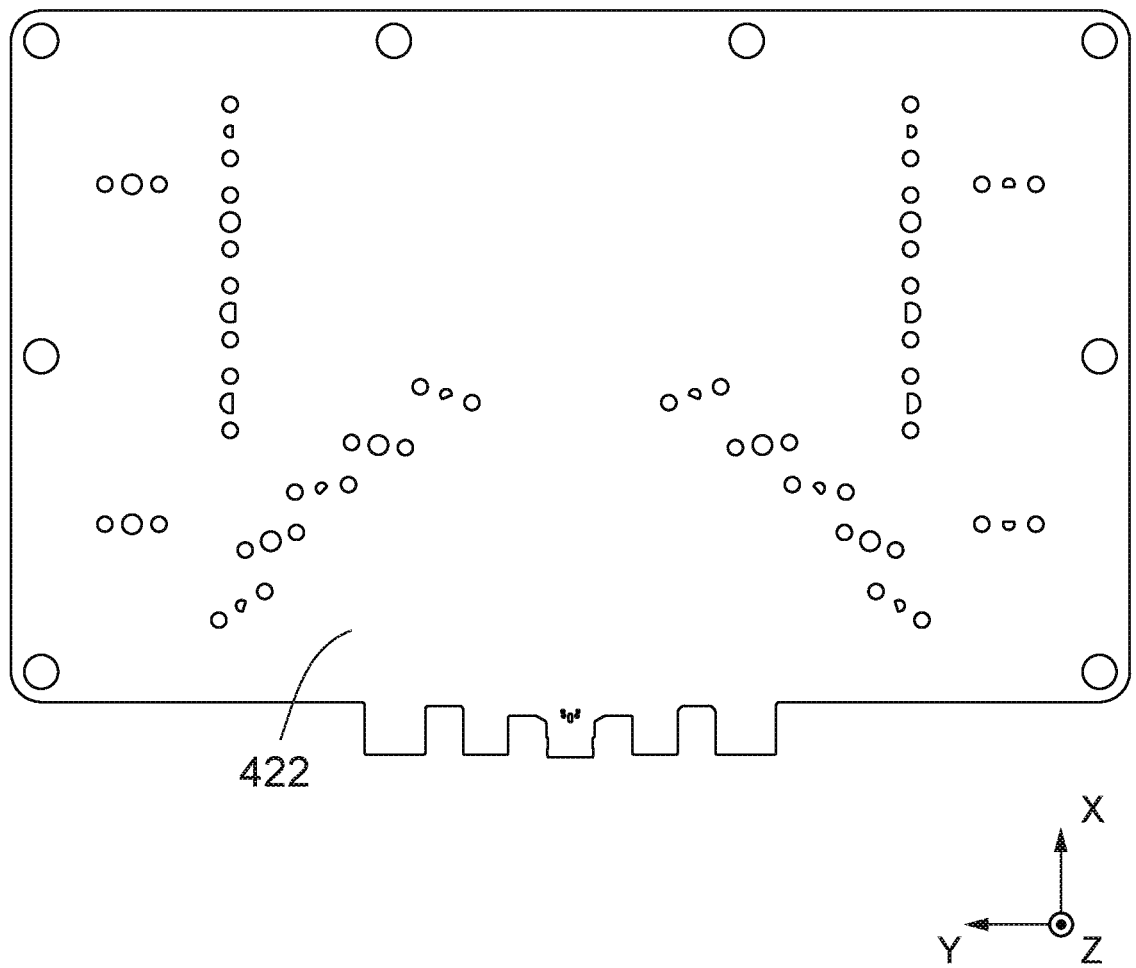
FIG. 13 is a plan view showing a third conductive layer included in the multilayer wiring board of FIG. 7. The third conductive layer is in a state before the via holes and the screw holes are formed. The outline of the multilayer wiring board is also drawn.

Referring to FIG. 13, the third conductive layer 302 is formed with a grounding pattern 422 occupying approximately the whole surface. In predetermined regions corresponding to via holes and screw holes, the grounding pattern 422 is not formed.

Figure 14:
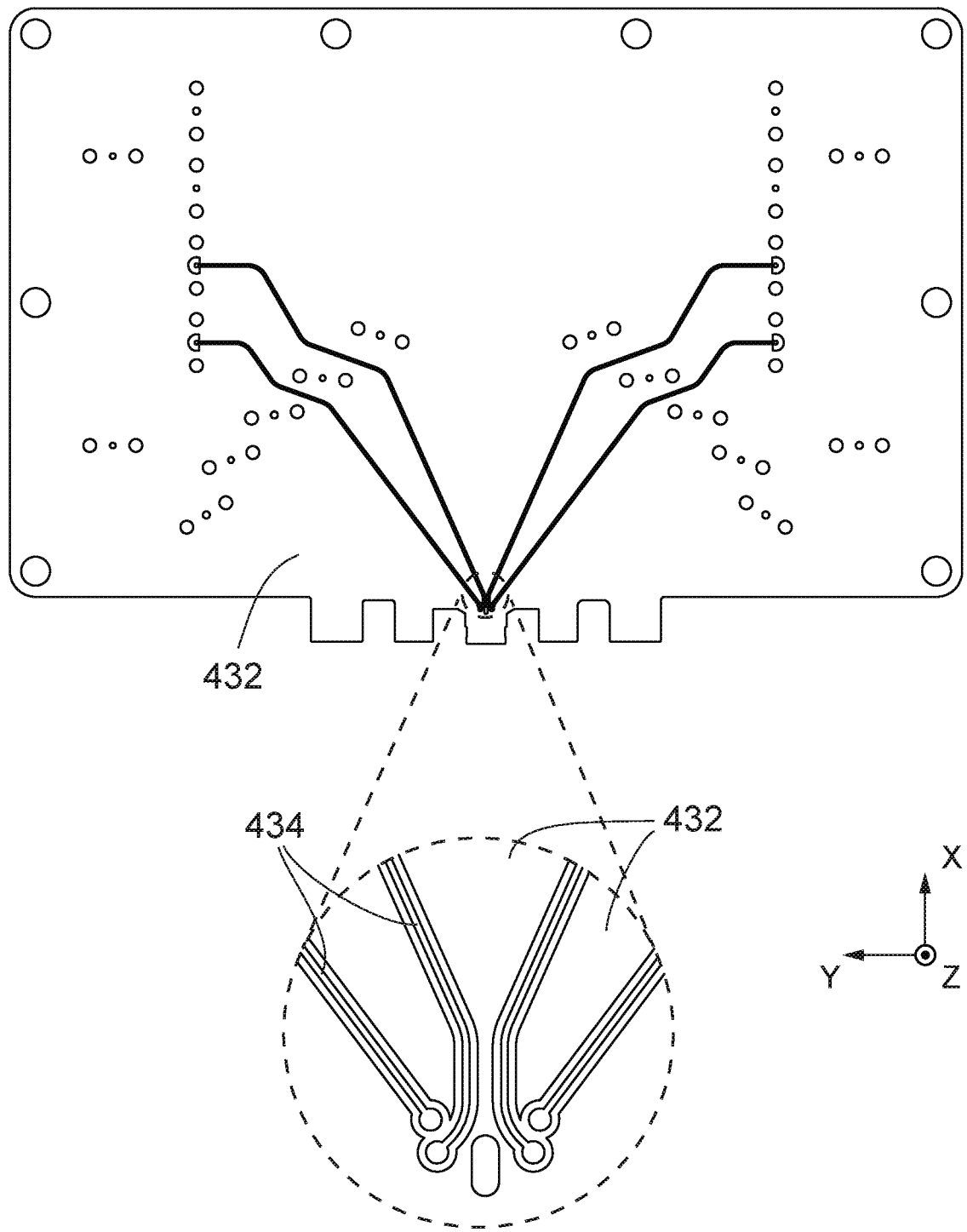
FIG. 14 is a plan view showing a fourth conductive layer included in the multilayer wiring board of FIG. 7. The fourth conductive layer is in a state before the via holes and the screw holes are formed. The outline of the multilayer wiring board is also drawn. Parts of wirings and a vicinity of them are enlarged and drawn.

Referring to FIG. 14, the fourth conductive layer 322 is formed with a grounding pattern 432 occupying approximately the whole surface. Similarly to the third conductive layer 302, the grounding pattern 432 is not formed in predetermined regions corresponding to the via holes and the screw holes. The fourth conductive layer 322 is further formed with four wirings 434. The wirings 434 are separated from the grounding pattern 432 electrically.

Figure 15:
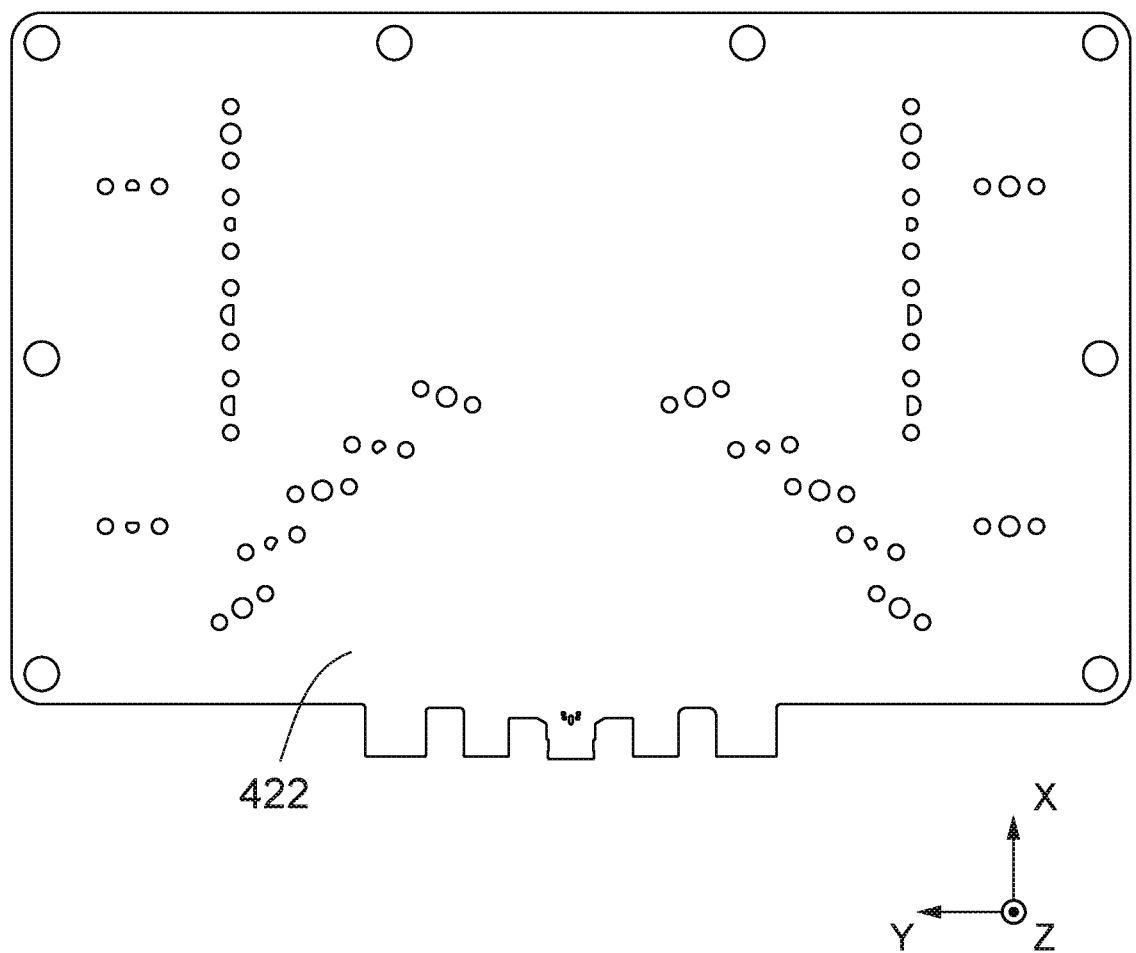
FIG. 15 is a plan view showing a fifth conductive layer included in the multilayer wiring board of FIG. 7. The fifth conductive layer is in a state before the via holes and the screw holes are formed. The outline of the multilayer wiring board is also drawn.

Referring to FIG. 15, the fifth conductive layer 342 is formed to have the same structure as the third conductive layer 302 (see FIG. 13).

Figure 16:
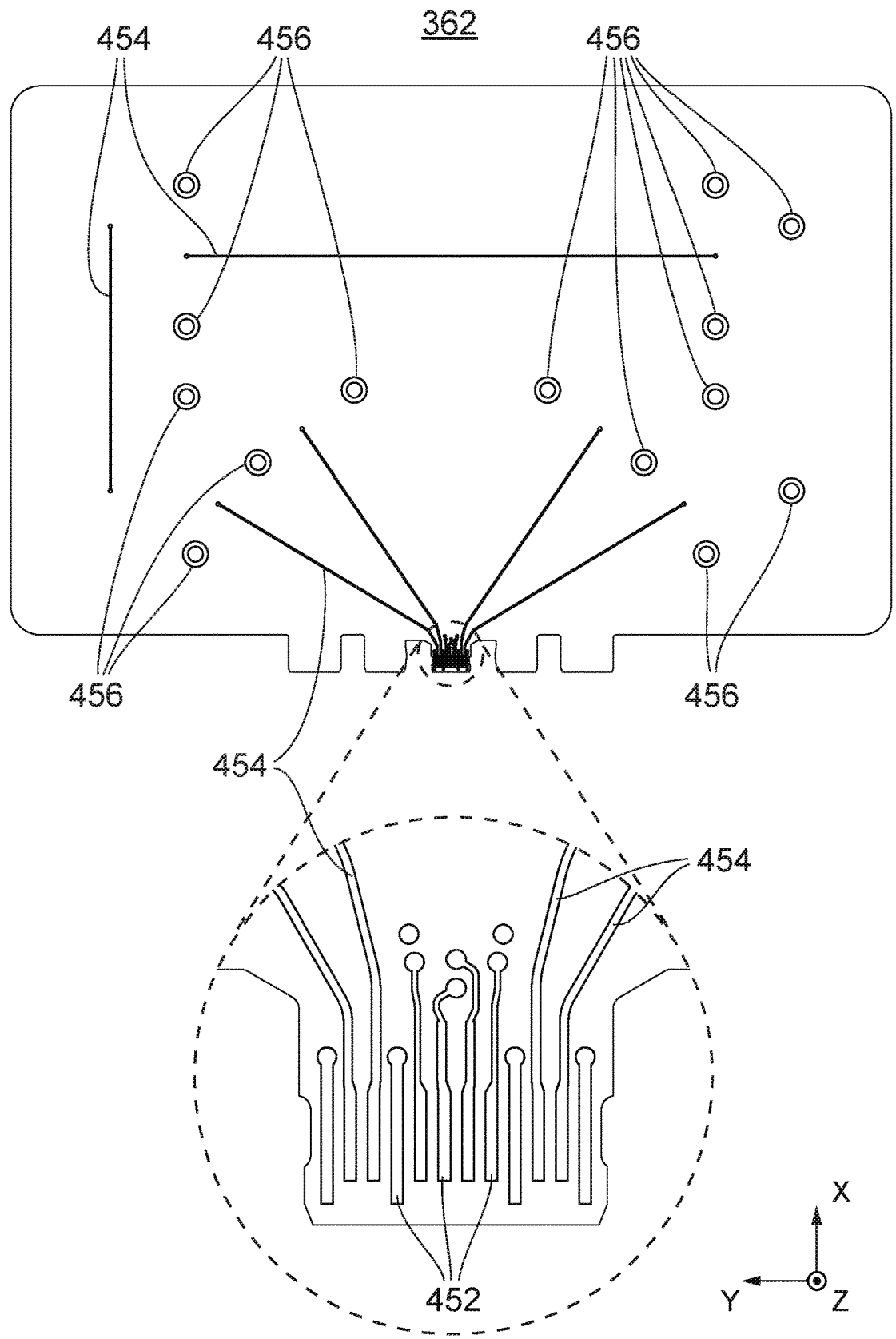
FIG. 16 is a plan view showing a sixth conductive layer included in the multilayer wiring board of FIG. 7. The sixth conductive layer is in a state before the via holes and the screw holes are formed. The outline of the multilayer wiring board is also drawn. The region corresponding to the connector main portion and the vicinity thereof are enlarged and drawn.

Referring to FIG. 16, the sixth conductive layer 362 is formed with a plurality of additional contacts 452 as some of the conductive patterns. The additional contacts 452 are formed to be included in the connector main portion 24 (see FIG. 7). Thus, the connector main portion 24 is provided with the additional contacts 452 formed in the sixth conductive layer (the additional inner conductive layer) 362. Moreover, the additional contacts 452 are formed to have the same shapes and the same arrangement as the contacts 412 (see FIG. 12). The sixth conductive layer 362 is further formed with a plurality of wirings 454. In the present embodiment, four of the wirings 454 are formed to be continuous with four of the additional contacts 452, respectively. The sixth conductive layer 362 is further formed with a plurality of lands 456 corresponding to the connection terminals 60.

Figure 17:
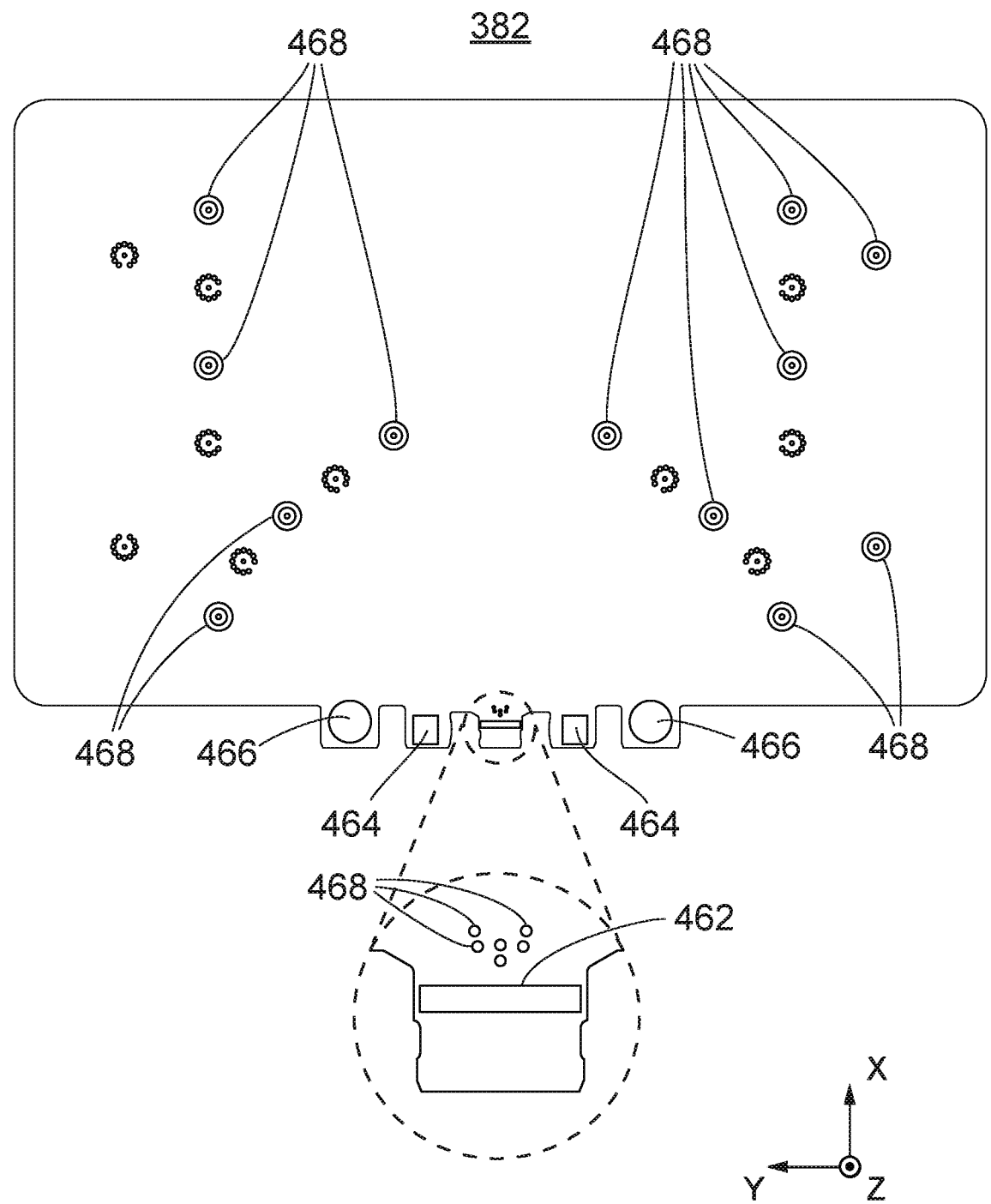
FIG. 17 is a plan view showing a seventh conductive layer included in the multilayer wiring board of FIG. 7. The seventh conductive layer is in a state before the via holes and the screw holes are formed. The outline of the multilayer wiring board is also drawn. The region corresponding to the connector main portion and the vicinity thereof are enlarged and drawn.

Referring to FIG. 17, the seventh conductive layer 382 is formed with an additional grounding plate 462 as one of the conductive patterns. The additional grounding plate 462 is formed to be included in the connector main portion 24 (see FIG. 7). Thus, the connector main portion 24 is provided with the additional grounding plate 462 formed in the seventh conductive layer (the additional surface conductive layer) 382. Moreover, the additional grounding plate 462 is formed to have the same shape and the same disposition as the grounding plate 402 (see FIG. 11). Moreover, the seventh conductive layer 382 is formed with additional conductive pads 464 and 466. The additional conductive pads 464 are formed to be included in the positioning portions 222 (see FIG. 7), respectively. The additional conductive pads 464 are formed to have the same shape and the same arrangement as the conductive pads 404 (see FIG. 11) when viewed along the up-down direction. The additional conductive pads 466 are formed to be included in the fixing portions 224 (see FIG. 7), respectively. The additional conductive pads 466 are formed to have the same shape and the same arrangement as the conductive pads 406 (see FIG. 11) when viewed along the up-down direction. The seventh conductive layer 382 is further formed with a plurality of lands 468 corresponding to the connection terminals 60.

As understood from FIGS. 9 and 11 to 17, the multilayer wiring board 20 is formed so that the connector main portion 24 is mateable with the mating connector 70 even if the multilayer wiring board 20 is inverted vertically. In other words, in the multilayer wiring board 20, positions of the first conductive layer 262 and the second conductive layer 282 and positions of the seventh conductive layer 382 and the sixth conductive layer 362 are mirror images of each other with respect to a plane perpendicular to the up-down direction. In detail, the positions of the first conductive layer 262 and the second conductive layer 282 and the positions of the seventh conductive layer 382 and the sixth conductive layer 362 are mirror images of each other with respect to an imaginary plane which is perpendicular to the up-down direction and passes the middle of the connector main portion 24 in the up-down direction.

Referring again to FIG. 9, the connector main portion 24 has an exposed portion 252. The exposed portion 252 is exposed outward in the up-down direction by removing partly the first conductive layer 262 and the first insulation layer 264 in a part of the multilayer wiring board 20 which is to be the connector main portion 24. In other words, the exposed portion 252 does not exist just after the first to the seventh conductive layers 262, 282, 302, 322, 342, 362 and 382 and the first to the sixth insulation layers 264, 284, 304, 344, 364 and 384 are laminated in a manufacturing process of the device 10. The connector main portion 24 is manufactured as follows.

First, the multilayer wiring board 20 is prepared. In detail, the first to the seventh conductive layers 262, 282, 302, 322, 342, 362 and 382 and the first to the sixth insulation layers 264, 284, 304, 344, 364 and 384 are laminated to obtain the multilayer wiring board 20. Next, in a predetermined section of the multilayer wiring board 20 which is to be the connector main portion 24, the grounding plate 402 is formed in the first conductive layer 262. Subsequently, in the predetermined section of the multilayer wiring board 20 which is to be the connector main portion 24, the first insulation layer 264 is partly cut to form the exposed portion 252. In detail, a part of the first insulation layer 264 which is located forward of the grounding plate 402 in the front-rear direction is partly cut to expose the second conductive layer 282 in part. In this way, the exposed portion 252 is formed to expose the second conductive layer 282 in part. As a result, the connector main portion 24 is formed, so that the second conductive layer 282 exposed in the exposed portion 252 forms the contact 412. Here, to form the exposed portion 252, a numerical control (NC) router (not shown) may be used. In particular, it is preferable to use an NC router called a conduction router. The conduction router can detect that a router bit (not shown) is brought into contact with an object (not shown) by giving an electrical potential difference between the router bit and the object. Accordingly, giving an electrical potential difference between the router bit and the second conductive layer 282 allows the conductive router to detect a state that the router bit pierces the first insulation layer 264 in the up-down direction and reaches the second conductive layer 282. If the router bit is moved in directions perpendicular to the up-down direction from that state, a predetermined extent of the first conductive layer 262 can be cut. In this manner, the exposed portion 252 can be formed to expose the second conductive layer 282 in part.

As understood from FIG. 9, the first insulation layer 264 has an end portion 266 adjacent to the exposed portion 252. The exposed portion 252 is located forward of the end portion 266 of the first conductive layer 262 in the front-rear direction and exposed outward in the up-down direction. In the exposed portion 252, each of the contacts 412 is exposed at least in part. Moreover, in the exposed portion 252, the second insulation layer 284 is exposed in part. In the present embodiment, upper surfaces of the contacts 412 exposed in the exposed portion 252 and an upper surface of the second insulation layer 284 are flush with each other. As understood from FIG. 9, when the end portion 266 of the first insulation layer 264 is viewed along the front-rear direction through a space which is located in front thereof, the second conductive layer 282 is not embedded in the first insulation layer 264. In this structure, the contacts 412 are contactable in the up-down direction. In particular, the contacts 412 are contactable from above.

As understood from FIGS. 9 and 10, the connector main portion 24 is formed to be mateable with the mating connector 70 even when it is inverted vertically. In other words, the connector main portion 24 has an exposed portion 254 on an undersurface side thereof. In the exposed portion 254, each of the additional contacts 452 is, at least in part, exposed outside as with the contacts 412. Moreover, in the exposed portion 254, the fifth insulation layer 364 is exposed to the outside in part as with the second insulation layer 284. Lower surfaces of the additional contacts 452 and a lower surface of the fifth insulation layer 364, which are exposed, are flush with each other. The additional contacts 452 are not embedded in the sixth insulation layer 384. In this structure, the additional contacts 452 are contactable in the up-down direction. In particular, the additional contacts 452 are contactable from beneath.

Figure 18:
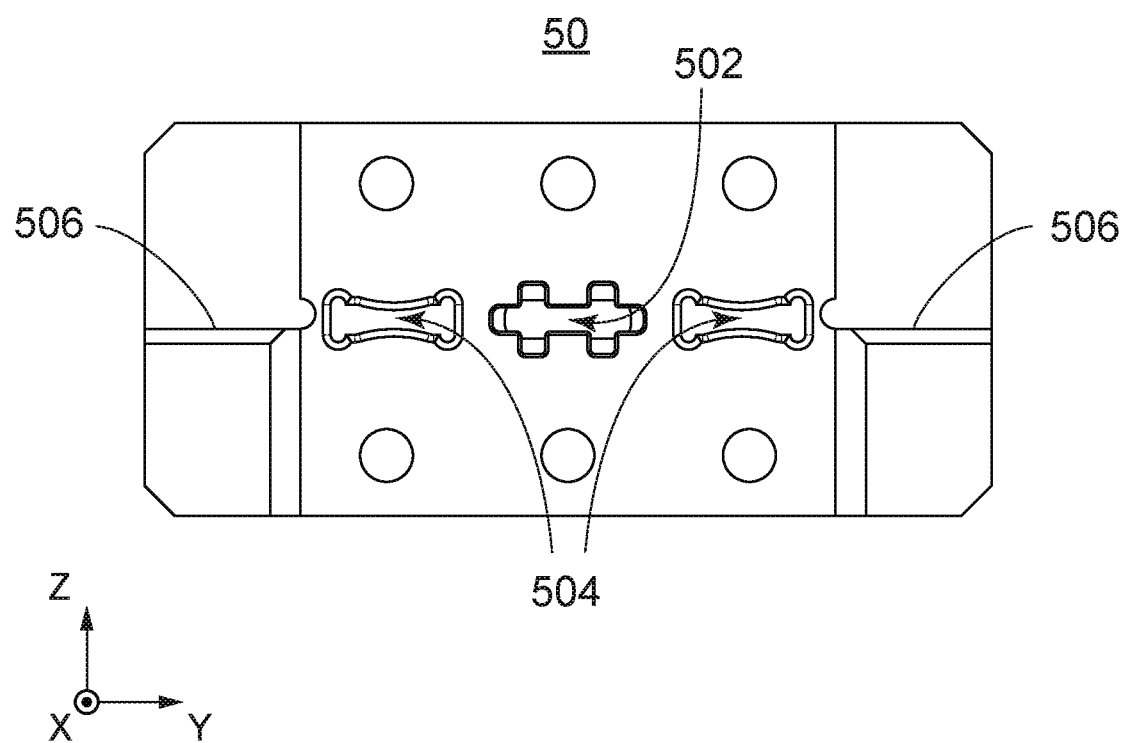
FIG. 18 is a rear view showing a guide member included in the device of FIG. 3.

Referring to FIG. 18, the guide member 50 is provided with a gap portion 502, a pair of receiving portions 504 and a pair of fixed portions 506. The gap portion 502 pierces the guide member 50 in the front-rear direction. The receiving portions 504 are recesses recessed forward in the front-rear direction. The guide member 50 may be formed by cut an aluminum block, for example.

As understood from FIGS. 1 and 3, the gap portion 502 of the guide member 50 receives, at least in part, the connector main portion 24. Each of the receiving portions 504 receives, at least in part, either one of the positioning portions 222. The fixed portions 506 are fixed to the fixing portions 224, respectively. Thus, the guide member 50 is fixed to the fixing portions 224. As shown in FIG. 6, to fix the fixed portions 506 to the fixing portions 224, bolts and nuts may be used.

As understood from FIG. 18, each of the receiving portions 504 has the middle portion and side portions in the lateral direction, and a size of the middle portion is smaller than a size of each of the side portions in the up-down direction. In a state before the positioning portions 222 are received by the receiving portions 504, the size of the middle portion of each of the receiving portions 504 is slightly smaller than a size of each of the positioning portions 222 in the up-down direction. However, the receiving portions 504 are formed to allow press-fitting of the positioning portions 222, respectively. In a state that the positioning portions 222 are press-fit into the receiving portions 504, the multilayer wiring board 20 is accurately positioned with respect to the guide member 50 in the up-down direction.

Referring again to FIG. 7, each of the positioning portions 222 is formed with a protruding portion 228 protruding inward of the multilayer wiring board 20 in the lateral direction. The protruding portions 228 protrude toward the connector main portion 24 in the lateral direction. In the lateral direction, an interval between the protruding portions 228 is equal to or slightly smaller than an interval of the receiving portions 504 of the guide member 50 (see FIG. 18). Accordingly, in the state that the positioning portions 222 are press-fit into the receiving portions 504, the multilayer wiring board 20 is accurately positioned with respect to the guide member 50 in the lateral direction.

As shown in FIG. 7, between the connector main portion 24 and each of the positioning portions 222, the body portion 220 has an abutment portion 230 located forward of the front edge 226. As understood from FIGS. 1 and 3, when the positioning portions 222 are press-fit into the receiving portions 504, the abutment portions 230 are brought into abutment with the guide member 50. In other words, in a state that the guide member 50 is attached to the multilayer wiring board 20, the guide member 50 abuts partly on the body portion 220 of the multilayer wiring board 20. Thus, in the state that the receiving portions 504 are press-fit into the positioning portions 222, the multilayer wiring board 20 is accurately positioned with respect to the guide member 50 in the front-rear direction.

Figure 19:
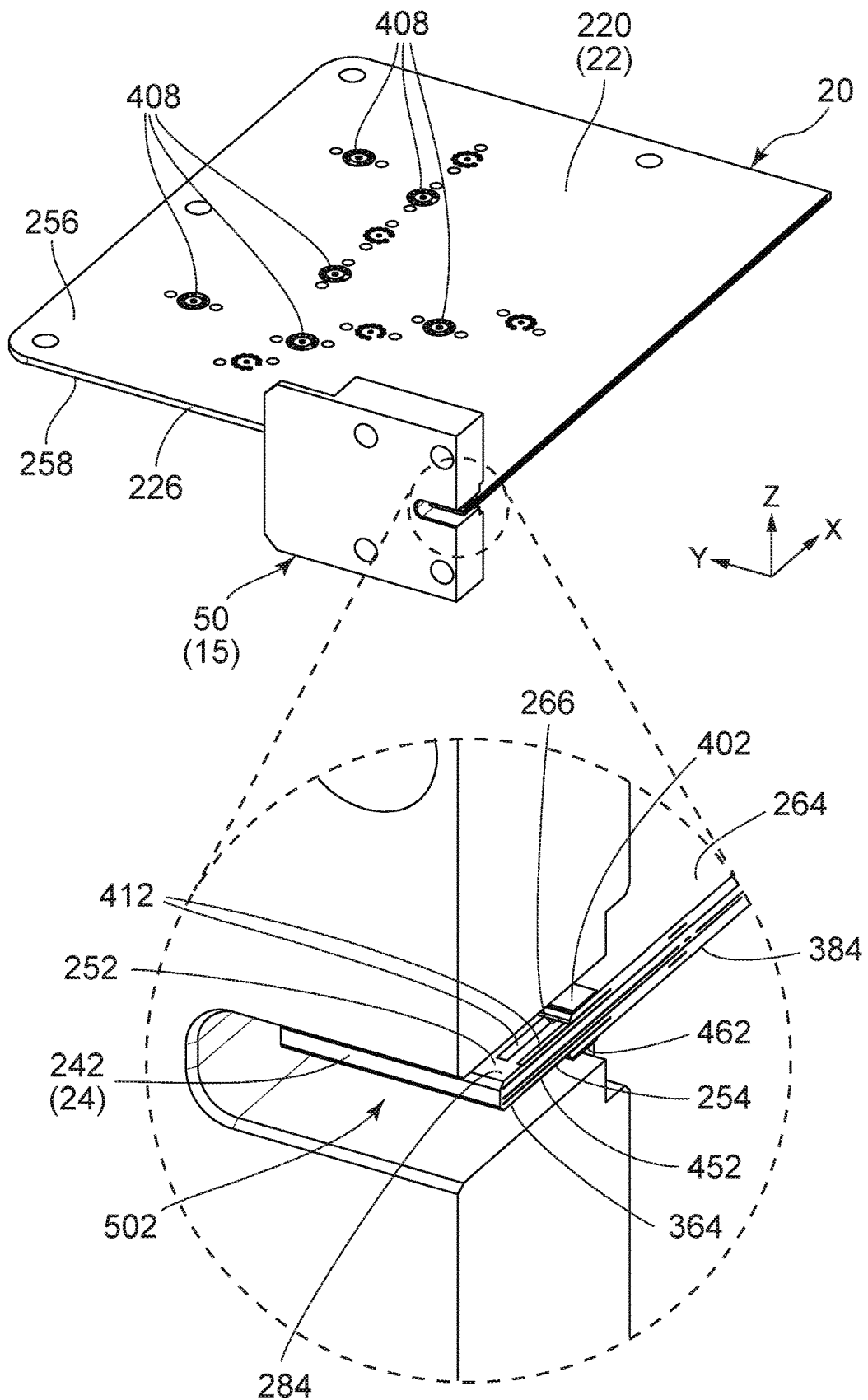
FIG. 19 is a front, perspective view showing a part obtained by cutting the device of FIG. 2. The connector main portion and the vicinity thereof are enlarged and drawn.
Figure 20:
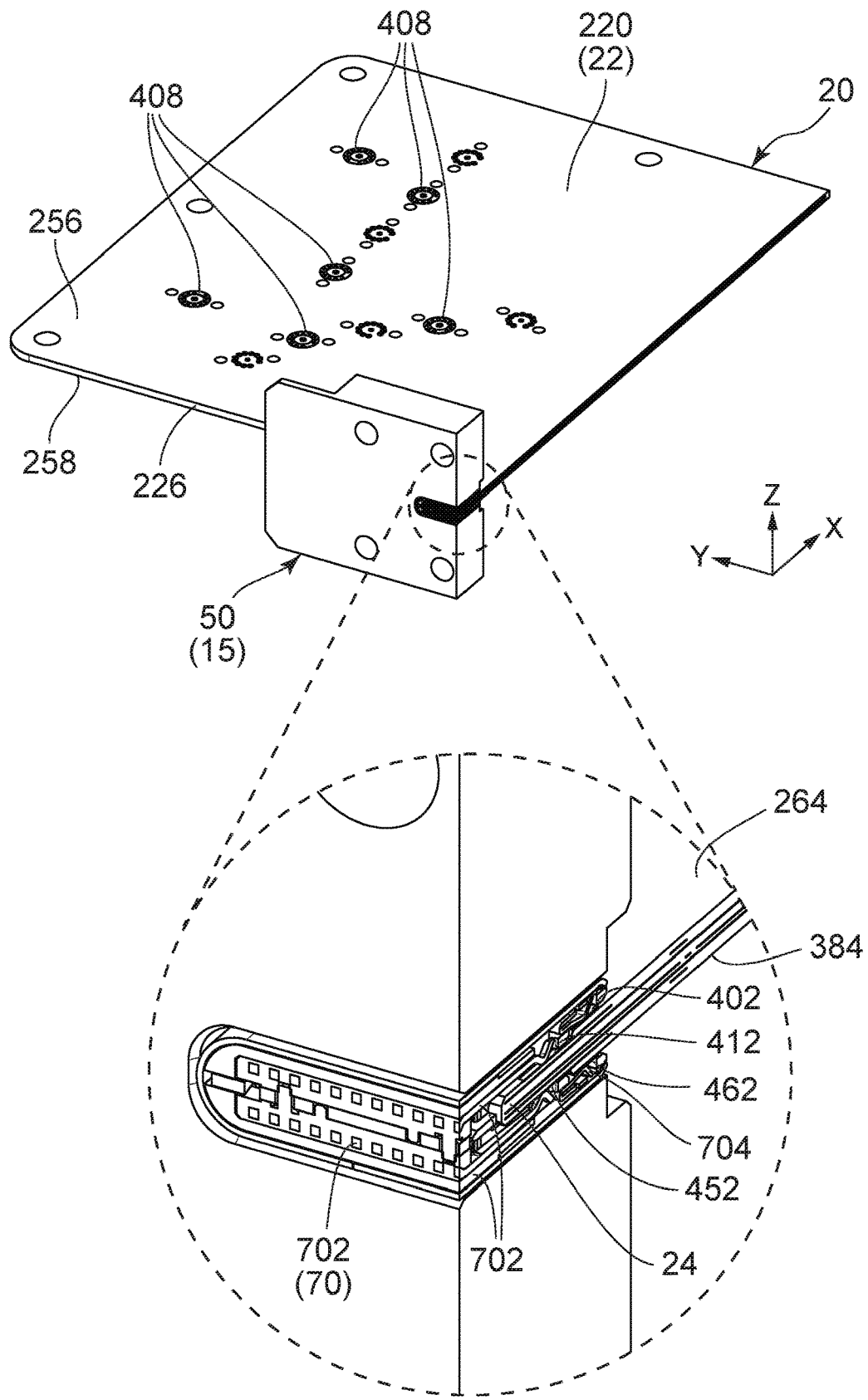
FIG. 20 is another front, perspective view showing the part of the device of FIG. 19. The connector main portion and the vicinity thereof are enlarged and drawn. The connector included in the device is mated with the mating connector.

As understood from FIG. 19 along with FIGS. 1 and 2, the gap portion 502 of the guide member 50 has an inner wall, and the inner wall surrounds the connector main portion 24 in directions perpendicular to the front-rear direction. In other words, the guide member 50 covers the connector main portion 24 in the directions perpendicular to the front-rear direction. In the present embodiment, the guide member 50 is formed so that the front end portion 242 of the connector main portion 24 is located in the gap portion 502. However, the present invention is not limited thereto. The guide member 50 may be formed so that the front end portion 242 of the connector main portion 24 protrudes forward of the gap portion 502. In other words, the guide member 50 may be modified, provided that the guide member 50 covers, at least in part, the connector main portion 24 in the directions perpendicular to the front-rear direction. As understood from FIGS. 5, 6 and 20, the guide member 50 serves as a guide to guide the mating connector 70 to the connector main portion 24. Moreover, the guide member 50 serves as a conductive shell of the connector 15.

Figure 21:
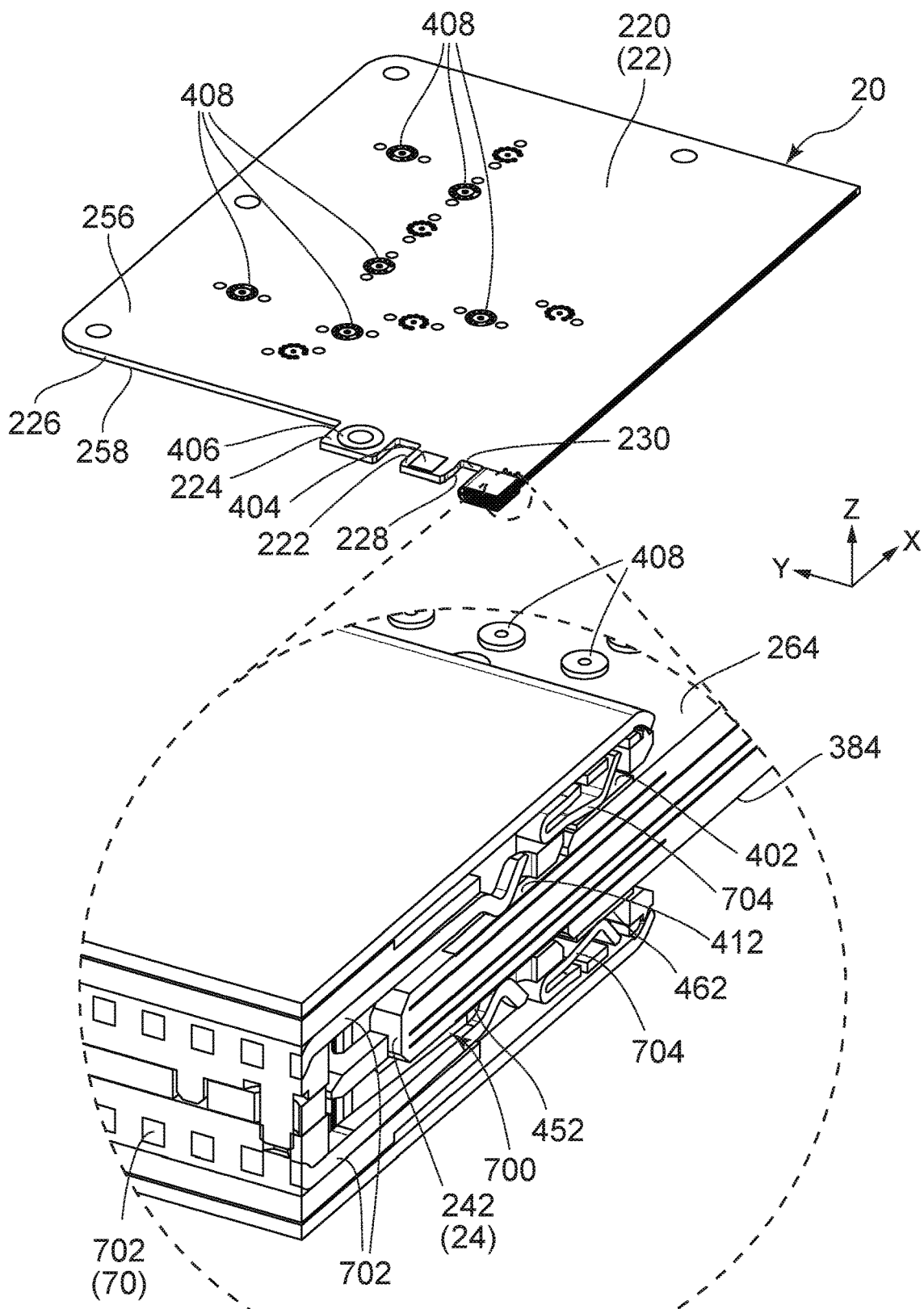
FIG. 21 is another front, perspective view showing the part of the multilayer wiring board of FIG. 9. The connector main portion and the vicinity thereof are enlarged and drawn. The connector included in the device is mated with the mating connector.
Figure 22:
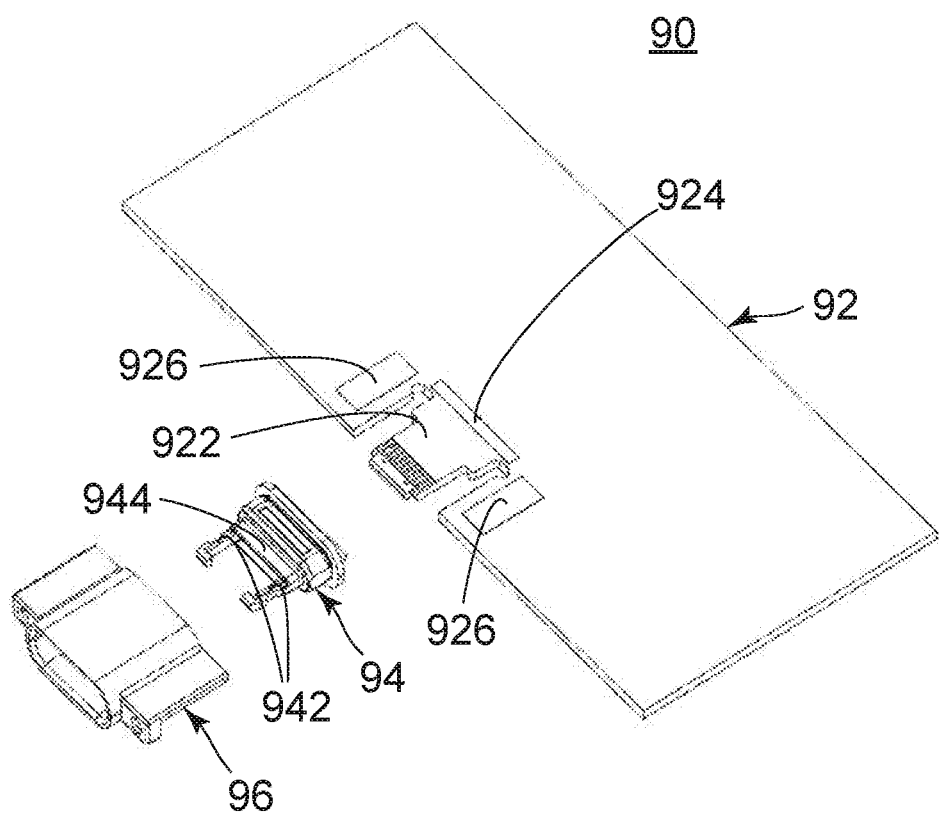
FIG. 22 is an exploded, perspective view showing a receptacle described in Patent Document 1.

As understood from FIG. 21, the mating connector 70 has an accommodation portion 700, which accommodates, at least in part, the connector main portion 24 when the connector 15 is mated with the mating connector 70. The mating connector 70 is further provided with mating contacts 702 corresponding to the contacts 412 and the additional contacts 452 of the connector 15 (see FIG. 2), respectively, and mating grounding members 704 corresponding to the grounding plate 402 and the additional grounding plate 462, respectively. Each of the mating contacts 702 and the mating grounding members 704 is partly exposed in an accommodation portion 700. When the connector 15 and the mating connector 70 are mated with each other, a principal part of the connector main portion 24 is accommodated in the accommodation portion 700 of the mating connector 70. As a result, each of the contacts 412 and the additional contacts 452 is brought into contact with the mating contact 702 corresponding thereto. At this time, each of the grounding plate 402 and the additional grounding plate 462 is brought into contact with the mating grounding member 704 corresponding thereto.

As described above, the connector 15 of the device 10 according to the present embodiment is provided with the connector main portion 24 formed as the part of the multilayer wiring board 20. The contacts 412, the additional contacts 452, the grounding plate 402 and the additional grounding plate 462, which are included in the connector main portion 24, are formed in the conductive layers included in the multilayer wiring board 20. Thus, the contacts 412, the additional contacts 452, the grounding plate 402 and the additional grounding plate 462 can be formed with high positioning accuracy. According to the connector 15 like this, desired electric characteristics can be obtained with high accuracy. In this way, the connector 15 of the device 10 according to the present embodiment has a structure which can possess the desired electric characteristics with high accuracy.

Although the specific explanation about the present invention is made above referring to the embodiments, the present invention is not limited thereto. For example, though the connector 15 of the embodiment mentioned above is mateable with the mating connector 70 even when it inverted vertically, the present invention is applicable to a connector which is incapable of being inverted vertically. Though, in the embodiment mentioned above, the conductive layers included in the wiring board are used for the grounding plate 402 and the contacts 412 without being processed, the surfaces of the grounding plate 402 and the contacts 412 may be plated.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector which has a main portion formed as a part of a multilayer wiring board and having a tongue shape, wherein:
   the multilayer wiring board comprises a surface conductive layer and an inner conductive layer;
   the inner conductive layer is located apart from and inward of the surface conductive layer in an up-down direction;
   the main portion comprises a grounding plate formed in the surface conductive layer and a plurality of contacts formed in the inner conductive layer; and
   each of the contacts is, at least in part, exposed and contactable in the up-down direction.

2. The connector as recited in claim 1, wherein:
   the multilayer wiring board further comprises a first insulation layer and a second insulation layer;
   the surface conductive layer is formed on the first insulation layer;
   the first insulation layer is located between the surface conductive layer and the inner conductive layer in the up-down direction;
   the inner conductive layer is, at least in part, embedded in the second insulation layer; and
   the second insulation layer is contiguous partly with the first insulation layer in the up-down direction.

3. The connector as recited in claim 2, wherein:
   the main portion has an exposed portion which is formed by removing the surface conductive layer and the first insulation layer in part and exposed outward in the up-down direction;
   the first insulation layer has an end portion adjacent to the exposed portion;
   the exposed portion is located forward of the end portion of the first insulation layer in a front-rear direction perpendicular to the up-down direction;
   each of the contacts is, at least in part, exposed in the exposed portion;
   the second insulation layer is exposed in part in the exposed portion; and
   the inner conductive layer is not embedded in the first insulation layer when the end portion of the first insulation layer is viewed along the front-rear direction through a space which is located in front thereof.

4. The connector as recited in claim 1, wherein:
   the connector is mateable with and removable from a mating connector comprising a mating grounding member; and
   when the connector and the mating connector are mated with each other, the grounding plate is brought into contact with the mating grounding member.

5. The connector as recited in claim 1, wherein:
   the multilayer wiring board further comprises an additional surface conductive layer and an additional inner conductive layer;
   positions of the surface conductive layer and the additional surface conductive layer are symmetrical with respect to a plane perpendicular to the up-down direction;

positions of the inner conductive layer and the additional inner conductive layer are symmetrical with respect to the plane perpendicular to the up-down direction;

the main portion comprises an additional grounding plate formed in the additional surface conductive layer and a plurality of additional contacts formed in the additional inner conductive layer; and each of the additional contacts is, at least in part, exposed and contactable in the up-down direction.

6. The connector as recited in claim 1, wherein:

the connector further comprises a guide member fixed to the multilayer wiring board; and the guide member covers the main portion in directions perpendicular to a front-rear direction perpendicular to the up-down direction.

7. A device comprising the connector recited in claim 5, wherein:

the connector further comprises a guide member fixed to the multilayer wiring board;

the guide member covers the main portion in directions perpendicular to a front-rear direction perpendicular to the up-down direction;

the device comprises a main board portion formed of the multilayer wiring board and formed integrally with the main portion;

the main board portion has a body portion and a positioning portion;

each of the main portion and the positioning portion protrudes forward from the body portion in the front-rear direction;

the positioning portion is provided with conductive pads which are formed in the surface conductive layer and the additional surface conductive layer, respectively;

the guide member is provided with a receiving portion which receives, at least in part, the positioning portion; and in a state before the positioning portion is received by the receiving portion, the receiving portion is slightly smaller than the positioning portion in size in the up-down direction.

8. The device as recited in claim 7, wherein:

the main board portion further has a fixing portion;

in a lateral direction perpendicular to both of the up-down direction and the front-rear direction, the positioning portion is located between the fixing portion and the main portion; and the guide member is fixed to the fixing portion.

9. The device as recited in claim 8, wherein between the main portion and the positioning portion, the guide member is brought into abutment with the body portion in part.

10. The device as recited in claim 7, wherein the positioning portion is provided with a protruding portion protruding toward the main portion in a lateral direction perpendicular to both of the up-down direction and the front-rear direction.

11. A method of manufacturing a connector having a main portion which is formed as a part of a multilayer wiring board and which has a tongue shape, the method comprising:

preparing the multilayer wiring board;

forming a grounding plate in a surface conductive layer of the multilayer wiring board in a predetermined section of the multilayer wiring board which is to be the main portion; and cutting, in the predetermined section, an insulation layer of the multilayer wiring board located forward of the grounding plate in a front-rear direction to expose part of an inner conductive layer of the multilayer wiring board;

wherein the exposed part of the inner conductive layer forms contacts so that the main portion is formed.

* * * * *